US012677422B2

(12) United States Patent
Lee et al.

(10) Patent No.: US 12,677,422 B2
(45) Date of Patent: Jul. 7, 2026

(54) THREE-DIMENSIONAL FERROELECTRIC MEMORY DEVICES

(71) Applicant: SAMSUNG ELECTRONICS CO., LTD., Suwon-si (KR)

(72) Inventors: Kyunghwan Lee, Suwon-si (KR); Yongseok Kim, Suwon-si (KR); Daewon Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 372 days.

(21) Appl. No.: 18/235,000

(22) Filed: Aug. 17, 2023

(65) Prior Publication Data

US 2024/0164108 A1    May 16, 2024

(30) Foreign Application Priority Data

Nov. 14, 2022    (KR) ........................ 10-2022-0151365

(51) Int. Cl.
    *H10B 51/20*    (2023.01)
    *H10B 51/10*    (2023.01)
    *H10D 30/69*    (2025.01)
    *H10D 64/68*    (2025.01)

(52) U.S. Cl.
    CPC ............. *H10B 51/20* (2023.02); *H10B 51/10* (2023.02); *H10D 30/701* (2025.01); *H10D 64/689* (2025.01)

(58) Field of Classification Search
    CPC ........ H10B 51/20; H10B 51/10; H10B 51/30; H10B 51/50; H10D 30/701; H10D 64/689
    See application file for complete search history.

(56) References Cited

U.S. PATENT DOCUMENTS

| | | | |
|---|---|---|---|
| 8,362,604 | B2 | 1/2013 | Ionescu |
| 9,559,118 | B2 | 1/2017 | Karda et al. |
| 9,818,848 | B2 | 11/2017 | Sun et al. |
| 10,727,336 | B2 | 7/2020 | Ramaswamy et al. |
| 10,978,485 | B2 | 4/2021 | Lue |
| 11,139,401 | B2 | 10/2021 | Doyle et al. |
| 11,502,128 | B2 | 11/2022 | Wu et al. |

(Continued)

FOREIGN PATENT DOCUMENTS

| | | |
|---|---|---|
| TW | 202111933 A | 3/2021 |
| TW | 202145219 A | 12/2021 |
| TW | 202303927 A | 1/2023 |

OTHER PUBLICATIONS

Office Action dated Jan. 20, 2025 from the Taiwan Patent Office for Taiwan Patent Application No. 112130027.

(Continued)

*Primary Examiner* — Victor A Mandala
(74) *Attorney, Agent, or Firm* — Muir Patent Law, PLLC

(57) ABSTRACT

A three-dimensional ferroelectric memory device includes a channel on a substrate and extending in a vertical direction substantially perpendicular to an upper surface of the substrate, a gate insulation pattern and a conductive pattern stacked on and surrounding a sidewall of the channel in a horizontal direction substantially parallel to the upper surface of the substrate, a ferroelectric pattern contacting a portion of an outer sidewall of the conductive pattern, a gate electrode contacting the ferroelectric pattern, and first and second source/drain patterns contacting lower and upper surfaces, respectively, of the channel.

20 Claims, 33 Drawing Sheets

(56) References Cited

U.S. PATENT DOCUMENTS

| 11,568,912 | B2 | 1/2023 | Young et al. | |
| 12,082,420 | B2 * | 9/2024 | Koo | H10B 51/20 |
| 2016/0181259 | A1 * | 6/2016 | Van Houdt | G11C 11/2273 |
| | | | | 257/295 |
| 2017/0117295 | A1 * | 4/2017 | Karda | H10B 51/20 |
| 2021/0184044 | A1 | 6/2021 | Liu et al. | |
| 2021/0217775 | A1 | 7/2021 | Zhang et al. | |
| 2021/0399052 | A1 | 12/2021 | Wu et al. | |
| 2022/0157364 | A1 | 5/2022 | Ramaswamy et al. | |
| 2022/0285401 | A1 * | 9/2022 | Cha | H10B 41/10 |
| 2023/0011675 | A1 * | 1/2023 | Lee | H10B 51/10 |
| 2023/0068706 | A1 * | 3/2023 | Bae | H10B 43/27 |
| 2023/0153592 | A1 * | 5/2023 | Nam | H10D 64/685 |
| 2023/0189529 | A1 * | 6/2023 | Wu | H10B 51/30 |
| | | | | 257/295 |
| 2023/0246084 | A1 * | 8/2023 | Rajashekhar | H10D 30/69 |
| | | | | 257/324 |
| 2023/0246085 | A1 * | 8/2023 | Kubo | H10B 43/10 |
| | | | | 257/324 |
| 2023/0269926 | A1 * | 8/2023 | Hsu | H10N 50/85 |
| | | | | 257/295 |
| 2023/0309314 | A1 * | 9/2023 | Lee | H10B 51/10 |
| 2024/0015978 | A1 * | 1/2024 | Cho | H10B 51/20 |
| 2024/0121965 | A1 * | 4/2024 | Vellianitis | H10B 51/20 |
| 2024/0196619 | A1 * | 6/2024 | Kambayashi | H10B 41/27 |
| 2025/0220915 | A1 * | 7/2025 | Lee | H10D 30/701 |
| 2025/0220917 | A1 * | 7/2025 | Lee | H10B 51/30 |
| 2026/0032916 | A1 * | 1/2026 | Yoo | H10B 51/30 |

OTHER PUBLICATIONS

Office Action and Search Report dated Sep. 30, 2024 from the Taiwan Patent Office for Taiwan Patent Application No. TW 112130027.

* cited by examiner 160                    170              160

150
140
130
120
110
100

A                                                A'

THREE-DIMENSIONAL FERROELECTRIC MEMORY DEVICES

CROSS-REFERENCE TO RELATED APPLICATION

This application claims priority under 35 U.S.C. § 119 to Korean Patent Application No. 10-2022-0151365, filed on Nov. 14, 2022, in the Korean Intellectual Property Office (KIPO), the disclosure of which is incorporated by reference herein in its entirety.

BACKGROUND

1. Field

Example embodiments relate to a three-dimensional ferroelectric memory device.

2. Description of the Related Art

A ferroelectric random access memory (FeRAM) device or a ferroelectric field effect transistor (FeFET) may be used as a memory device, which is simpler than a dynamic random access memory (DRAM) device and a non-volatile memory device, e.g., a flash memory device. Recently, a three-dimensional (3D) FeRAM device has been developed in order to have a high integration degree. However, a method of enhancing the electric characteristics of the 3D FeRAM device is needed.

SUMMARY

According to example embodiments, there is provided a three-dimensional ferroelectric memory device, including a channel on a substrate and extending in a vertical direction substantially perpendicular to an upper surface of the substrate, a gate insulation pattern and a conductive pattern stacked on and surrounding a sidewall of the channel in a horizontal direction substantially parallel to the upper surface of the substrate, a ferroelectric pattern contacting a portion of an outer sidewall of the conductive pattern, a gate electrode contacting the ferroelectric pattern, and first and second source/drain patterns contacting lower and upper surfaces, respectively, of the channel.

According to example embodiments, there is provided a three-dimensional ferroelectric memory device, including a channel on a substrate and extending in a vertical direction substantially perpendicular to an upper surface of the substrate, a gate insulation pattern, a conductive pattern, a conductive pattern and a gate electrode sequentially stacked on a sidewall of the channel in a horizontal direction substantially parallel to the upper surface of the substrate, and first and second source/drain patterns contacting lower and upper surfaces, respectively, of the channel. An area of a portion of the gate insulation pattern between and contacting the channel and the conductive pattern may be greater than an area of a portion of the ferroelectric pattern between and contacting the conductive pattern and the gate electrode.

According to example embodiments, there is a three-dimensional ferroelectric memory device, including a bit line on a substrate and extending in a first direction substantially parallel to an upper surface of the substrate, a first source/drain pattern contacting an upper surface of the bit line, a channel contacting an upper surface of the first source/drain pattern and extending in a vertical direction substantially perpendicular to an upper surface of the substrate, a gate insulation pattern and a conductive pattern stacked on and surrounding a sidewall of the channel in a horizontal direction substantially parallel to the upper surface of the substrate, a ferroelectric pattern contacting a portion of an outer sidewall of the conductive pattern, a word line contacting the ferroelectric pattern and extending in a second direction substantially parallel to the upper surface of the substrate and crossing the first direction, a second source/drain pattern contacting an upper surface of the channel, and a source line contacting an upper surface of the second source/drain pattern, the source line extending in the first direction.

BRIEF DESCRIPTION OF THE DRAWINGS

Features will become apparent to those of skill in the art by describing in detail exemplary embodiments with reference to the attached drawings, in which.

DETAILED DESCRIPTION

The above and other features of example embodiments will be described in detail below with reference to the accompanying drawings.

Hereinafter, two directions among horizontal directions, which are substantially parallel to an upper surface of a substrate and crossing each other, may be defined as first and second directions D1 and D2, respectively, and a vertical direction substantially perpendicular to the upper surface of the substrate may be defined as a third direction D3. In example embodiments, the first and second directions D1 and D2 may be substantially perpendicular to each other.

Figure 1:
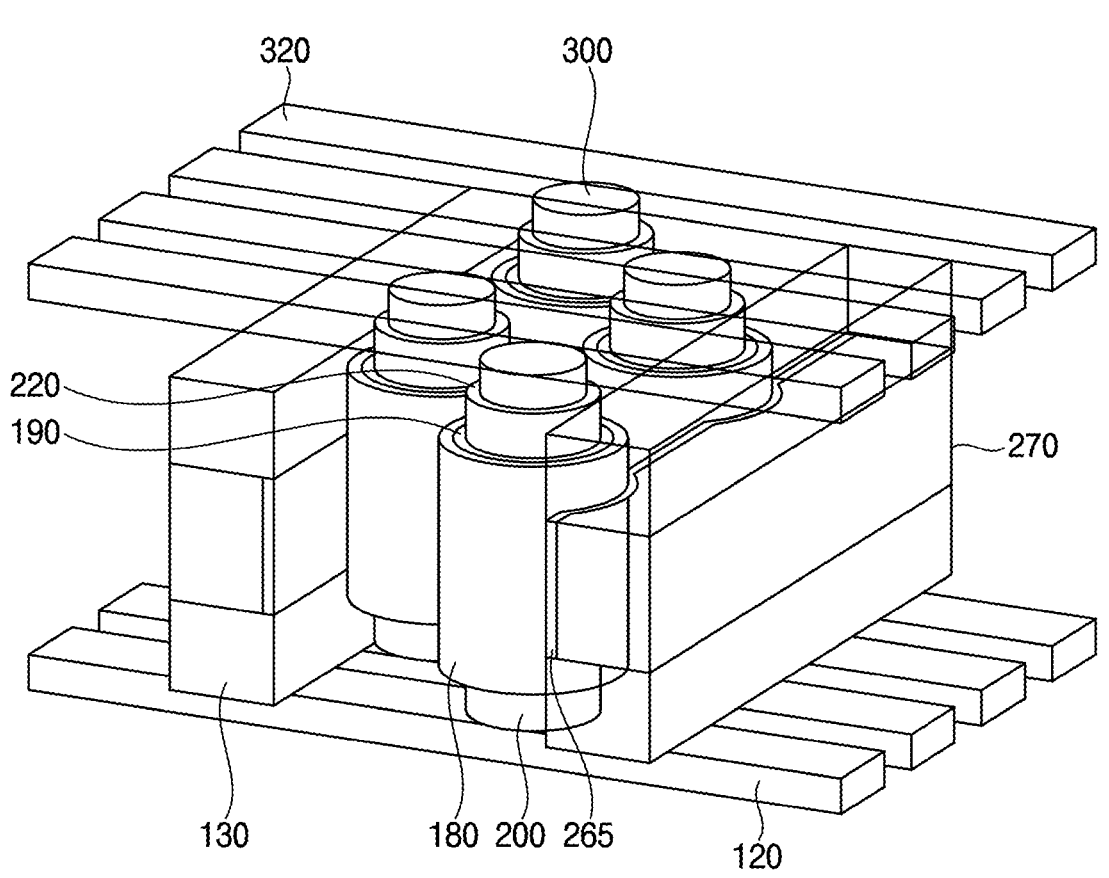
FIG. 1 is a perspective view of a three-dimensional ferroelectric memory device in accordance with example embodiments.
Figure 2A:
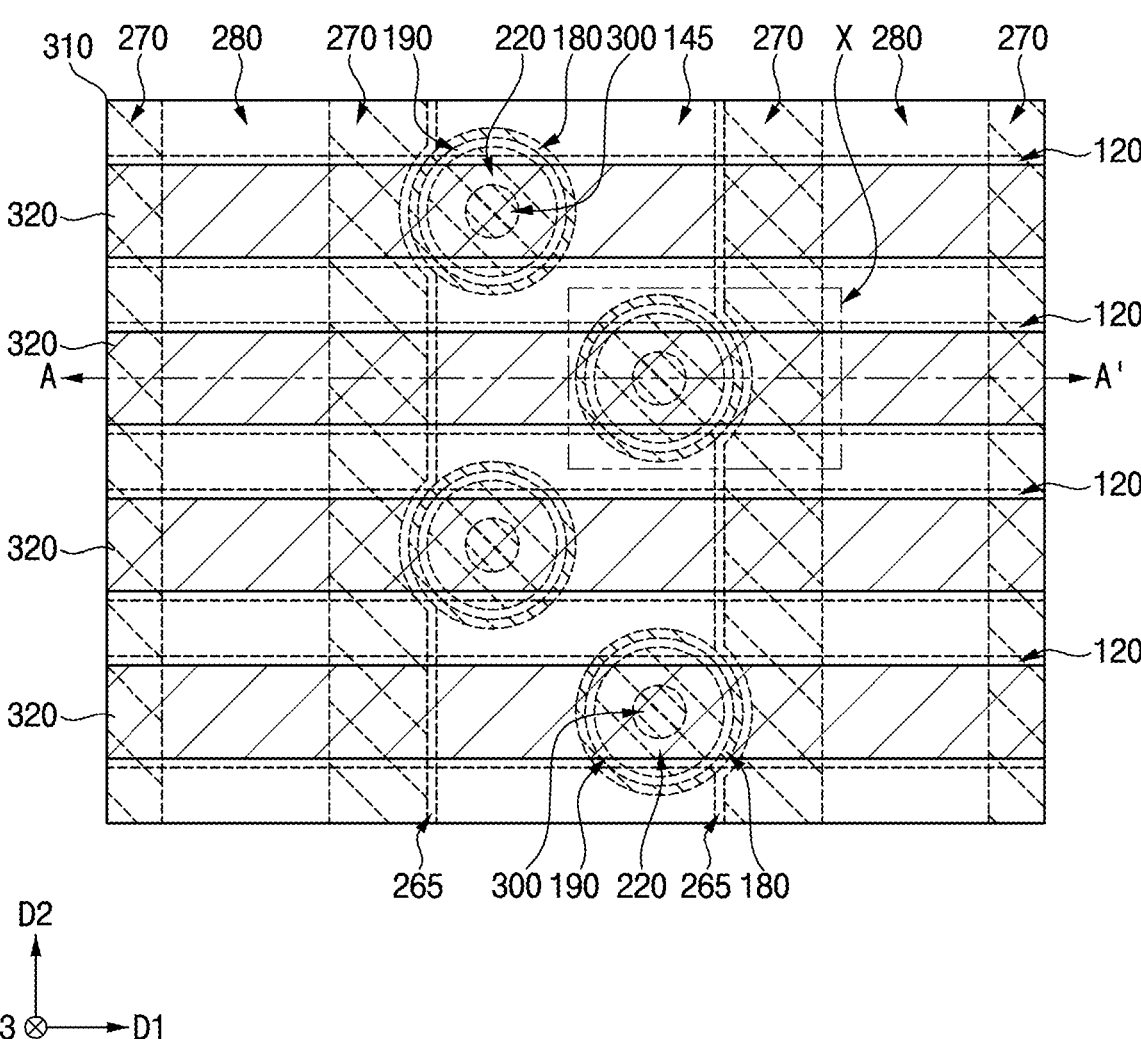
FIGS. 2A and 2B are a plan view of FIG. 1 and an enlarged portion 'X' of FIG. 2A, respectively.
Figure 2B:
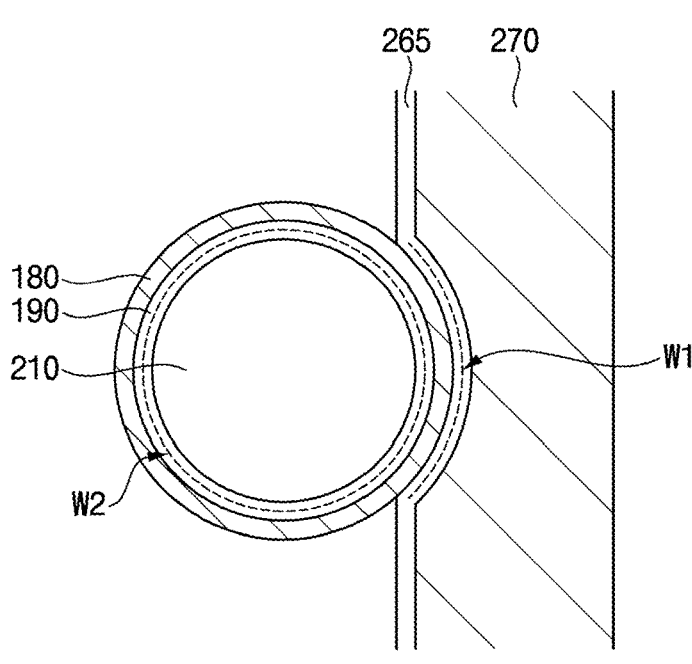
Figure 3A:
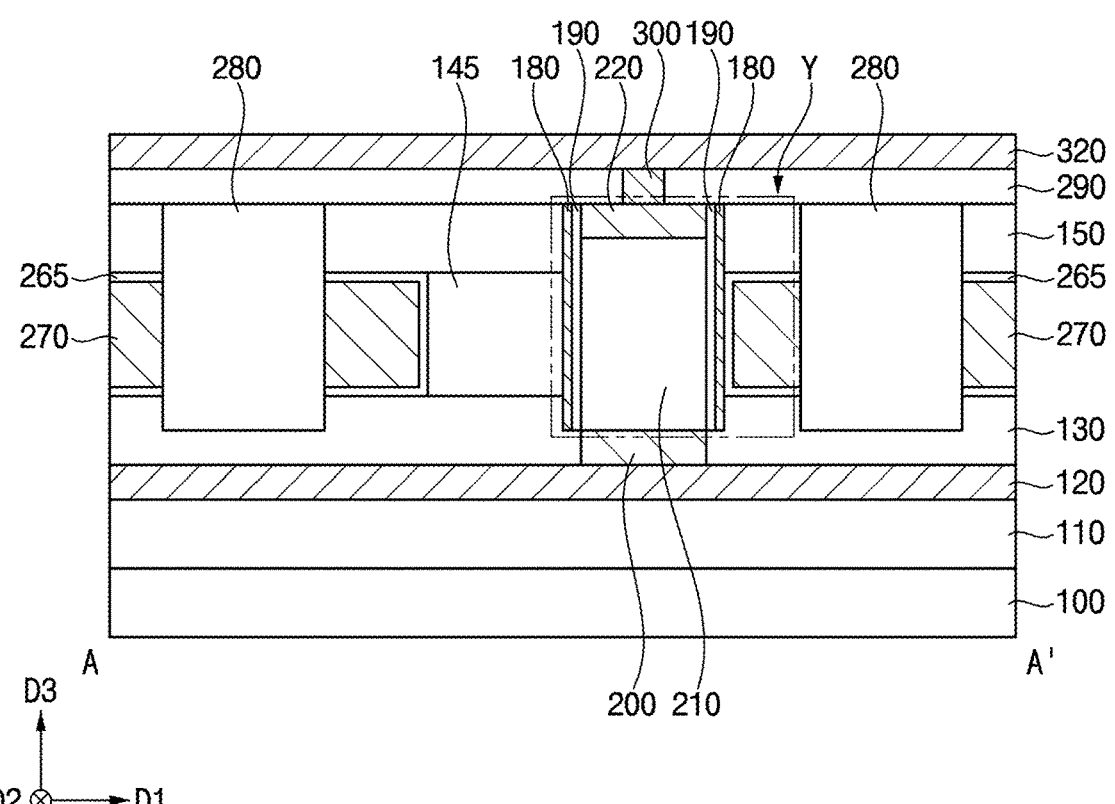
FIGS. 3A and 3B are a cross-sectional view of FIG. 2A and an enlarged portion 'Y' of FIG. 3A, respectively.
Figure 3B:
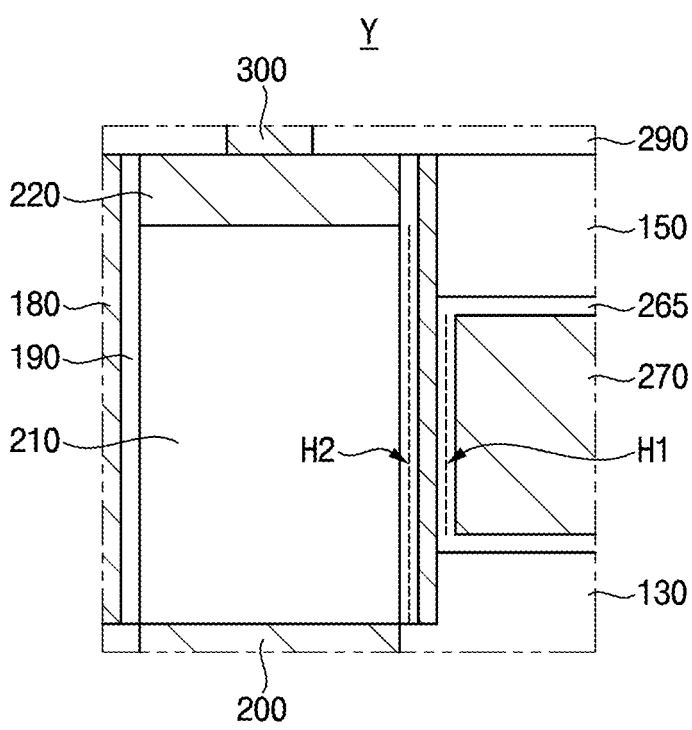

FIG. 1 is a perspective view of a three-dimensional ferroelectric memory device in accordance with example embodiments. FIG. 2A is a plan view of FIG. 1, and FIG. 2B is an enlarged plan view of portion 'X' in FIG. 2A. FIG. 3A is a cross-sectional view along line A-A' of FIG. 2A, and FIG. 3B is an enlarged view of portion 'Y' in FIG. 3A.

FIG. 2B does not show a second source/drain pattern 220, fourth and fifth insulating interlayers 290 and 310, and a third wiring 320 in order to avoid complexity of the drawing. Additionally, FIG. 1 does not show some elements and is drawn as a transparent style in order to avoid complexity of the drawing, e.g., upper portions of a first gate insulation pattern 190 and a conductive pattern 180 are deleted so as to show the second source/drain pattern 220. A more detailed location relationships between the first gate insulation pattern 190, the conductive pattern 180, and the second source/drain pattern 220 may be referred to FIG. 3B.

Referring to FIGS. 1, 2A, 2B, 3A, and 3B, a three-dimensional (3D) ferroelectric memory device may include a first wiring 120, a second wiring 270, a ferroelectric pattern 265, a conductive pattern 180, a first gate insulation pattern 190, a first channel 210, a first source/drain pattern 200, a second source/drain pattern 220, a third wiring 320, and a first contact plug 300 on a first substrate 100. Additionally, the 3D ferroelectric memory device may further include first to fifth insulating interlayers 110, 130, 150, 290 and 310, and first and second insulation patterns 145 and 280.

For example, the first substrate 100 may include a semiconductor material, e.g., silicon, germanium, silicon-germanium, etc., or a III-V group compound semiconductor, e.g., GaP, GaAs, GaSb, etc. In an example embodiment, the first substrate 100 may be a silicon-on-insulator (SOI) substrate or a germanium-on-insulator (GOI) substrate.

The first insulating interlayer 110 may be positioned on the first substrate 100, and may include an oxide, e.g., silicon oxide. Various types of circuit patterns, e.g., transistors, contact plugs, wirings, etc., may be formed on the first substrate 100, and may be covered by the first insulating interlayer 110.

The first wiring 120 may extend through an upper portion of the first insulating interlayer 110. In example embodiments, the first wiring 120 may extend in the first direction D1, and a plurality of first wirings 120 may be spaced apart from each other in the second direction D2. In example embodiments, the first wiring 120 may serve as a bit line of the 3D ferroelectric memory device.

The second insulating interlayer 130 may be formed on the first insulating interlayer 110 and the first wiring 120, and may include an oxide, e.g., silicon oxide.

The first insulation pattern 145 may be formed on the second insulating interlayer 130, and may extend in the second direction D2. The first insulation pattern 145 may include an insulating nitride, e.g., silicon nitride.

The second wiring 270 (i.e., a gate electrode) may be formed on each of opposite sides in the first direction D1 of the first insulation pattern 145 on the second insulating interlayer 130, and may extend in the second direction D2. Lower and upper surfaces and a sidewall facing a sidewall of the first insulation pattern 145 of the second wiring 270 may be covered by the ferroelectric pattern 265. Thus, the ferroelectric pattern 265 may, e.g., directly, contact the sidewall of the first insulation pattern 145. Additionally, lower and upper surfaces of the ferroelectric pattern 265 may be substantially coplanar with the lower and upper surfaces of the first insulation pattern 145, respectively.

In example embodiments, the second wiring 270 may serve as a word line of the 3D ferroelectric memory device. The second wiring 270 may include, e.g., a metal, a metal nitride, a metal silicide, etc.

The ferroelectric pattern 265 may include, e.g., hafnium oxide doped with zirconium, silicon, aluminum, yttrium, gadolinium, lanthanum, scandium, strontium, etc. For example, the ferroelectric pattern 265 may have a multi-layered structure including a plurality of patterns, each of which may have one of the above materials. In another example, the ferroelectric pattern 265 may have a first pattern including one of the above materials and a second pattern including an insulating material, e.g., silicon oxide.

The third insulating interlayer 150 may be formed on the first insulation pattern 145 and the ferroelectric pattern 265. The third insulating interlayer 150 may include an oxide, e.g., silicon oxide.

The second insulation pattern 280 may extend through the third insulating interlayer 150, the ferroelectric pattern 265, the second wiring 270, and an upper portion of the second insulating interlayer 130 in the second direction D2. Thus, the second wiring 270 may be separated by the second insulation pattern 280 in the first direction D1, and the ferroelectric pattern 265 may be separated by the second insulation pattern 280 in the first direction D1. The second insulation pattern 280 may include an oxide, e.g., silicon oxide.

In example embodiments, a pillar structure may extend through the third insulating interlayer 150, the first insulation pattern 145, and the upper portion of the second insulating interlayer 130. Thus, the pillar structure may contact a sidewall of the first insulation pattern 145. The pillar structure may also partially extend through the second wiring 270 extending in the second direction D2, and a sidewall of the second wiring 270 facing the pillar structure may be covered by the ferroelectric pattern 265.

In example embodiments, a plurality of pillar structures may be spaced apart from each other in the first and second directions D1 and D2. For example, as illustrated in FIG. 2A, the pillar structures may be arranged in a zigzag pattern in the second direction D2, e.g., as viewed in a top view. In another example, the pillar structures may be arranged by a constant distance in the first and second directions D1 and D2. The pillar structure may have a shape of, e.g., a circle, an ellipse, a polygon, a polygon with rounded corners, etc., in a plan view (e.g., in a top view).

The pillar structure may include the first channel 210 extending in the third direction D3, the second source/drain pattern 220 on, e.g., an upper surface of, the first channel 210, a first gate insulation pattern 190 covering sidewalls of the first channel 210 and the second source/drain pattern 220, and a conductive pattern 180 covering a sidewall of the first gate insulation pattern 190. Thus, each of the first channel 210 and the second source/drain pattern 220 may have a shape of, e.g., a cylinder, a cylindroid, a square pillar, etc., and each of the first gate insulation pattern 190 and the conductive pattern 180 may have a shape of, e.g., a hollow cylinder.

For example, the first channel 210 may include a semiconductor material, e.g., polysilicon, silicon-germanium, etc. In another example, the first channel 210 may include an oxide semiconductor material, e.g., IGZO, Sn-IGZO, IWO, $CuS_2$, $CuSe_2$, $WSe_2$, IZO, ZTO, YZO, etc.

The second source/drain pattern 220 may include polysilicon doped with n-type impurities, e.g., phosphorus, arsenic, etc., or polysilicon doped with p-type impurities, e.g., boron, gallium, etc. The first gate insulation pattern 190 may include an oxide, e.g., silicon oxide, and the conductive pattern 180 may include, e.g., a metal, a metal nitride, a metal silicide, etc.

The first source/drain pattern 200 may extend through the second insulating interlayer 130, and may contact a lower surface of the first channel 210. The first source/drain pattern 200 may have a shape of, e.g., a cylinder, a cylindroid, a square pillar, etc. The first source/drain pattern 200 may include polysilicon doped with n-type impurities, e.g., phosphorus, arsenic, etc., or polysilicon doped with p-type impurities, e.g., boron, gallium, etc.

The fourth insulating interlayer 290 may be formed on the third insulating interlayer 150, the second insulation pattern 280 and the pillar structure, and may include an oxide, e.g., silicon oxide.

The first contact plug 300 may extend through the fourth insulating interlayer 290, and may contact an upper surface of the second source/drain pattern 220. The first contact plug 300 may include, e.g., a metal, a metal nitride, a metal silicide, etc.

The fifth insulating interlayer 310 may be formed on the fourth insulating interlayer 290 and the first contact plug 300, and may include an oxide, e.g., silicon oxide. In example embodiments, the third wiring 320 may extend through the fifth insulating interlayer 310 in the first direction D1, and may contact an upper surface of the first contact plug 300. In example embodiments, a plurality of third wirings 320 may be spaced apart from each other in the second direction D2. The third wiring 320 may serve as a source line of the 3D ferroelectric memory device. The third wiring 320 may include, e.g., a metal, a metal nitride, a metal silicide, etc.

Referring to FIGS. 2B and 3B, the ferroelectric pattern 265 between and contacting the second wiring 270, which may serve as a word line (i.e., a gate electrode), and the conductive pattern 180 may have a first width W1 in the horizontal direction and a first height H1 in the vertical direction. Additionally, the first gate insulation pattern 190 between the conductive pattern 180 and the first channel 210 may have a second width W2 in the horizontal direction and a second height H2 in the vertical direction.

The ferroelectric pattern 265 may contact only a portion of the sidewall of the conductive pattern 180, e.g., only a portion of the sidewall of the conductive pattern 180 that faces and overlaps the second wiring 270. Thus, the second width W2 of the first gate insulation pattern 190 (which entirely surrounds the sidewall of the first channel 210 (e.g., in a top view)) may be greater than the first width W1 of the ferroelectric pattern 265. For example, as illustrated in FIG. 2B, a length of the first gate insulation pattern 190 around an entire perimeter of the first channel 210, e.g., in a top view (along the dashed line corresponding to W2), may be greater than a length of the ferroelectric pattern 265 along the portion of the conductive pattern 180 that overlaps the second wiring 270, e.g., in a top view (along the dashed line corresponding to W1).

Additionally, a length in the vertical direction of the second wiring 270 may be less than a length in the vertical direction of the conductive pattern 180. Thus, the second height H2 of the first gate insulation pattern 190 (which covers an entire height of a sidewall of the conductive pattern 180) may be greater than the first height H1 of the ferroelectric pattern 265. For example, as illustrated in FIG. 3B, the height H2 of the first gate insulation pattern 190 along the entire height of the first channel 210 between upper and lower surfaces thereof, e.g., in a vertical cross-sectional view (along the dashed line corresponding to H2), may be greater than the height H1 of the ferroelectric pattern 265 that overlaps the first channel 210 in the horizontal direction, e.g., in a vertical cross-sectional view (along the dashed line corresponding to H1).

Thus, an area of a portion of the first gate insulation pattern 190 between the conductive pattern 180 and the first channel 210 (e.g., an area of a portion of a surface of the first gate insulation pattern 190 overlapping both the conductive pattern 180 and the first channel 210 in the horizontal direction) may be greater than an area of a portion of the ferroelectric pattern 265 between the second wiring 270 and the conductive pattern 180 (e.g., an area of a portion of a surface of the ferroelectric pattern 265 overlapping both the second wiring 270 and the conductive pattern 180). Thus, an electric capacitance of a second capacitor including the first channel 210, the first gate insulation pattern 190, and the conductive pattern 180 may be greater than an electric capacitance of a first capacitor including the second wiring 270, the ferroelectric pattern 265, and the conductive pattern 180.

Accordingly, when a voltage is applied to the second wiring 270, the first and second capacitors are connected in series, so that a voltage applied to the first capacitor may be greater than a voltage applied to the second capacitor. As a result, a magnitude of an electric field on the ferroelectric pattern 265 included in the second capacitor may increase so as to enhance the switching efficiency of the ferroelectric pattern 265, and a magnitude of an electric field on the first gate insulation pattern 190 included in the first capacitor may decrease so as to enhance the endurance of the first gate insulation pattern 190.

Figure 4:
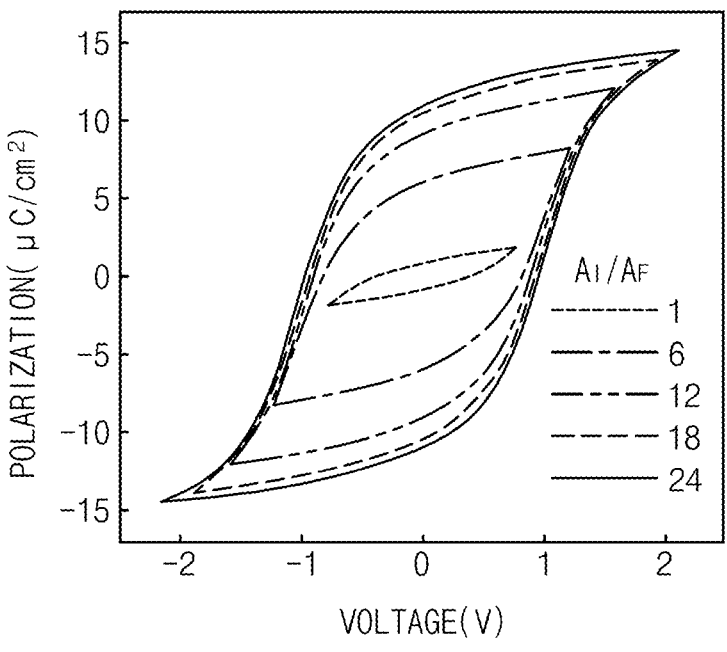
FIG. 4 is a polarization hysteresis curve according to ratios $(A_I/A_F)$ of an area of the first gate insulation pattern with respect to an area of the ferroelectric pattern.

FIG. 4 is a polarization hysteresis curve according to ratios ($A_I/A_F$) of an area of the first gate insulation pattern 190 with respect to an area of the ferroelectric pattern 265.

Referring to FIG. 4, as the ratio ($A_I/A_F$) of the area ($A_I$) of the first gate insulation pattern 190 included in the first capacitor with respect to the area ($A_F$) of the ferroelectric pattern 265 included in the second capacitor increases, the memory window increases.

As illustrated above, in the 3D ferroelectric memory device, the area of the first gate insulation pattern 190 included in the second capacitor may be greater than the area of the ferroelectric pattern 265 included in the first capacitor, so that the 3D ferroelectric memory device may have enhanced memory window, and the first gate insulation pattern 190 may have enhanced endurance.

FIGS. 5, 7, 9, 11, 13, 15, 17 and 19 are plan views illustrating stages in a method of manufacturing a 3D ferroelectric memory device in accordance with example embodiments. FIGS. 6, 8, 10, 12, 14, 16, 18 and 20 are cross-sectional views taken along lines A-A' of corresponding plan views, respectively.

Figure 5:
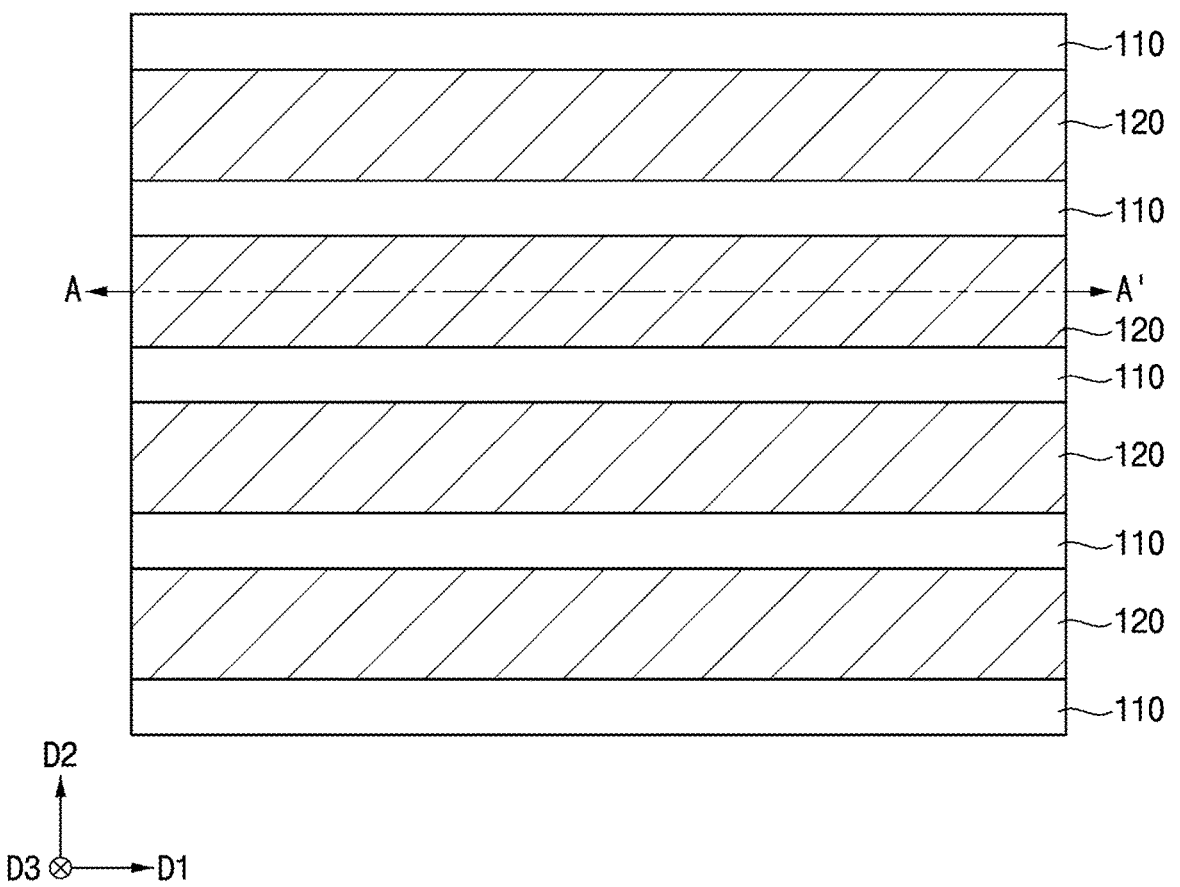
FIGS. 5, 7, 9, 11, 13, 15, 17 and 19 are plan views illustrating stages in a method of manufacturing a three-dimensional ferroelectric memory device in accordance with example embodiments.
Figure 6:
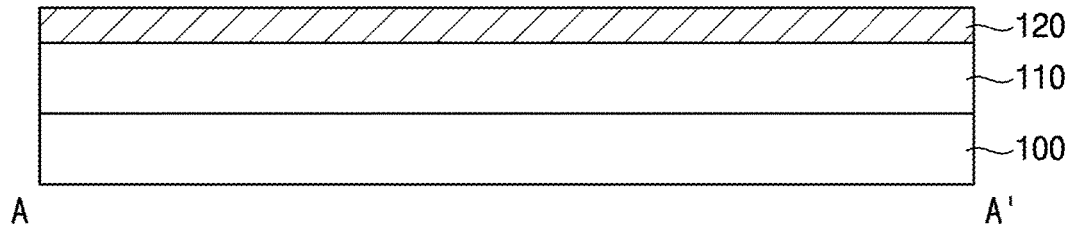
FIGS. 6, 8, 10, 12, 14, 16, 18 and 20 are cross-sectional views taken along lines A-A' of corresponding plan views, respectively.
Figure 6:
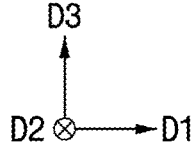

Referring to FIGS. 5 and 6, the first insulating interlayer 110 may be formed on the first substrate 100. An upper portion of the first insulating interlayer 110 may be partially removed to form a trench, and the first wiring 120 may be formed in the trench.

In example embodiments, the first wiring 120 may extend in the first direction D1, and a plurality of first wirings 120 may be spaced apart from each other in the second direction D2. In example embodiments, the first wiring 120 may serve as a bit line of the 3D ferroelectric memory device.

Alternatively, the first insulating interlayer 110 and a first wiring layer may be sequentially stacked on the first substrate 100, the first wiring layer may be patterned to form the first wiring 120, and an insulating interlayer pattern may be formed on the first substrate 100 to cover a sidewall of the first wiring 120.

Various circuit elements, e.g., transistors, contact plugs, wirings may be formed on the first substrate 100, and may be covered by the first insulating interlayer 110.

Figure 7:
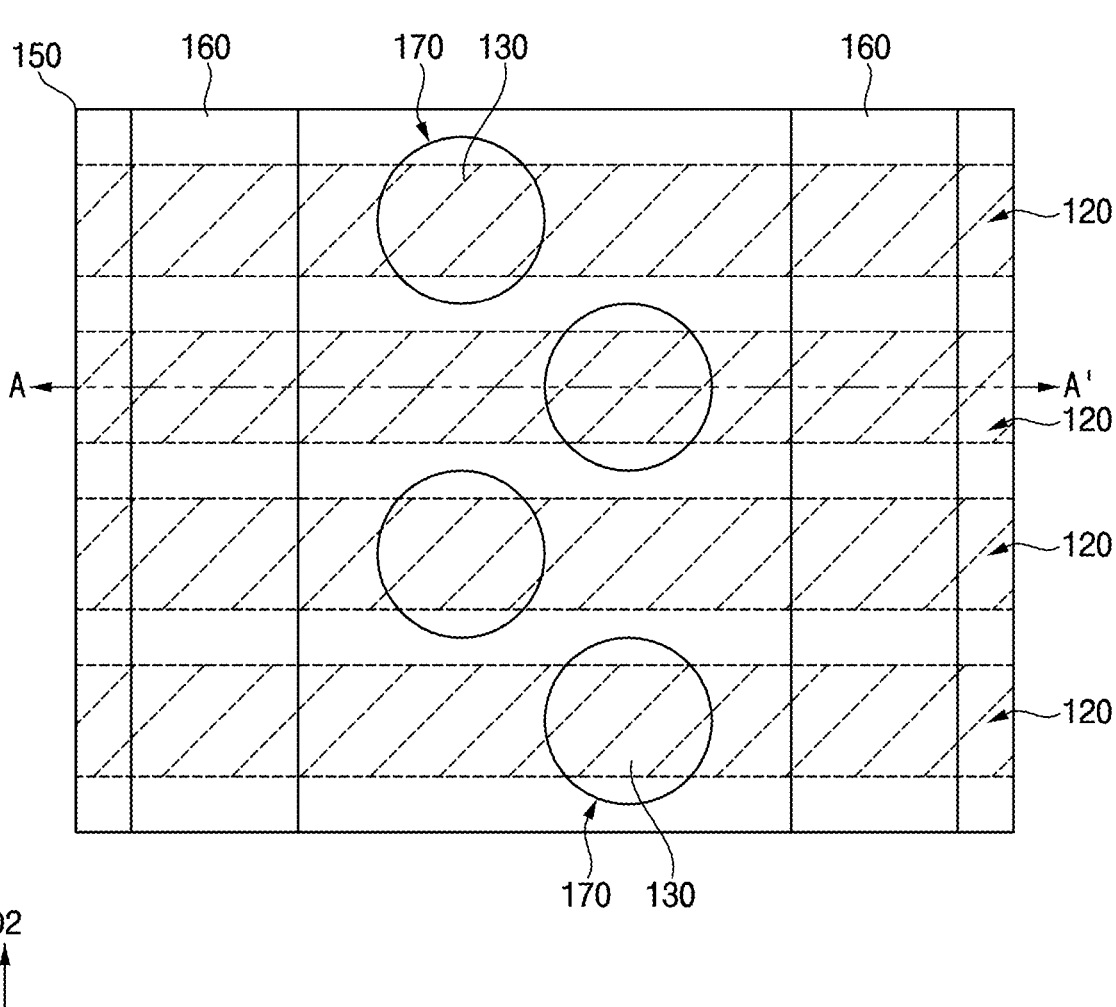
Figure 8:
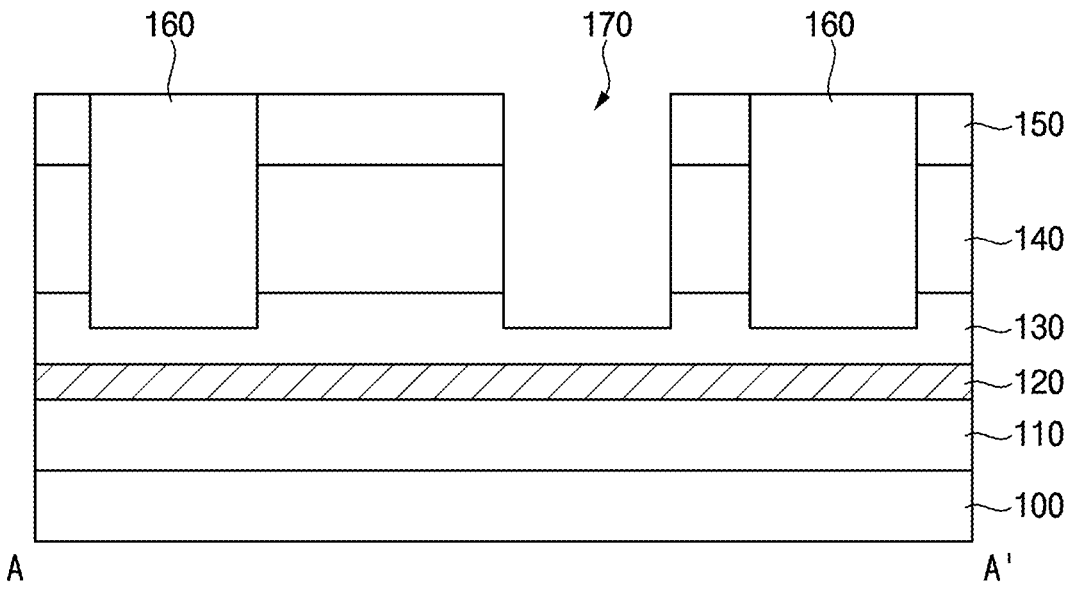
Figure 8:
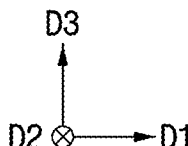

Referring to FIGS. 7 and 8, the second insulating interlayer 130, a first sacrificial layer 140, and the third insulating interlayer 150 may be sequentially stacked on the first insulating interlayer 110 and the first wiring 120. A first opening may be formed through the third insulating interlayer 150, the first sacrificial layer 140, and an upper portion of the second insulating interlayer 130, and a second sacrificial layer 160 may be formed in the first opening.

The first sacrificial layer 140 may include an insulating nitride, e.g., silicon nitride, and the second sacrificial layer 160 may include, e.g., polysilicon. In example embodiments, the second sacrificial layer 160 may extend in the second direction D2, and a plurality of second sacrificial layers 160 may be spaced apart from each other in the first direction D1.

A second opening 170 may be formed through the third insulating interlayer 150, the first sacrificial layer 140, and the upper portion of the second insulating interlayer 130. The second opening 170 may have a shape of, e.g., a circle, an ellipse, a polygon, a polygon with rounded corners, etc., in a plan view. In example embodiments, a plurality of second openings 170 may be spaced apart from each other in the first and second directions D1 and D2 between ones of the second sacrificial layers 160 neighboring in the first direction D1. In an example embodiment, the second openings 170 may be arranged in the second direction D2, which is shown in FIG. 7. Alternatively, the second openings 170 may be arranged by a constant distance in each of the first and second directions D1 and D2.

In some embodiments, the first opening and the second opening 170 may be formed by the same etching process. For example, referring to FIG. 7, each of the first openings may extend in the second direction D2 (between two adjacent solid lines indicated in FIG. 7) and may be filled with the second sacrificial layer 160 (as illustrated in FIG. 8), and each of the second openings 170 may be empty and expose a portion of the second insulating interlayer 130 (as illustrated in FIG. 8), with the first wirings 120 (i.e., dashed lines in FIG. 7) being below the second insulating interlayer 130 and not visible through the first openings or second openings 170.

Figure 9:
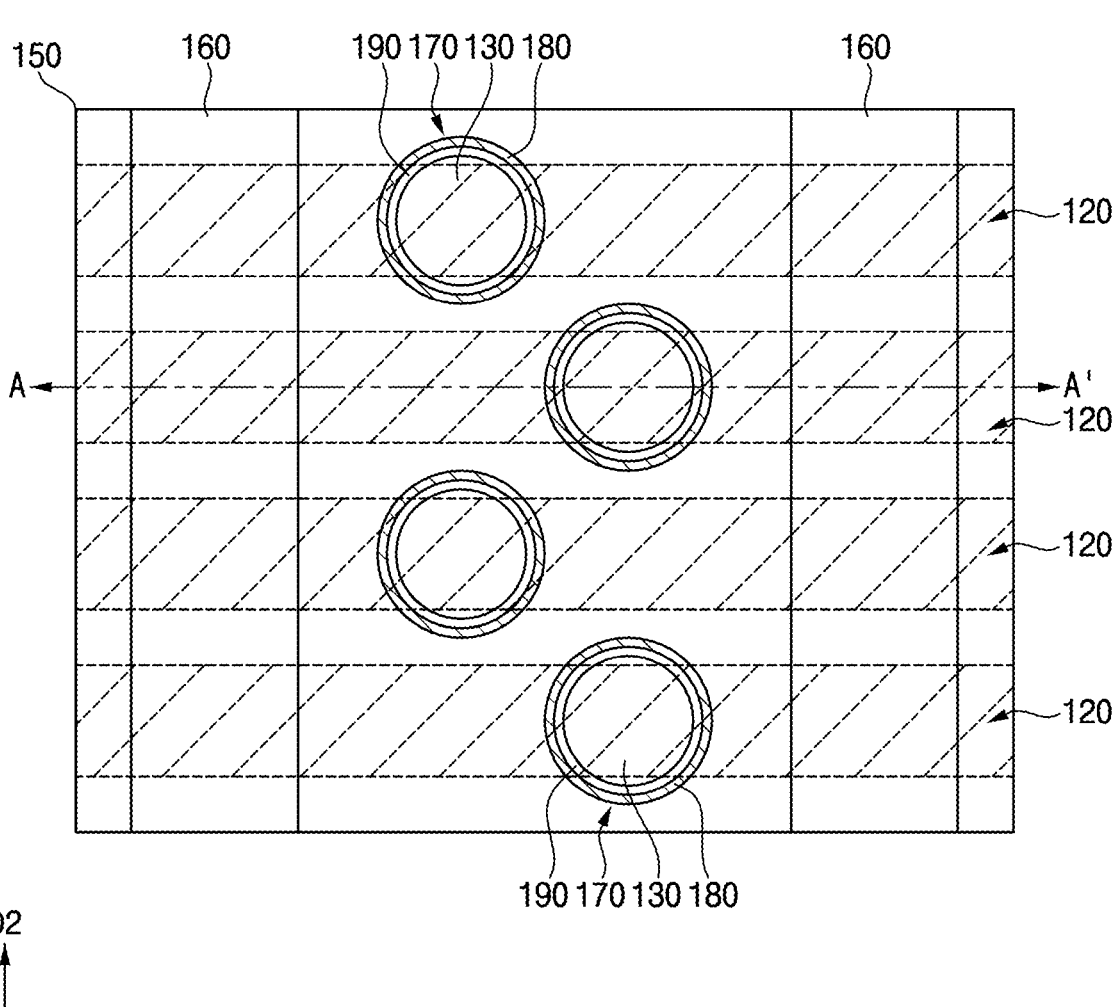
Figure 10:
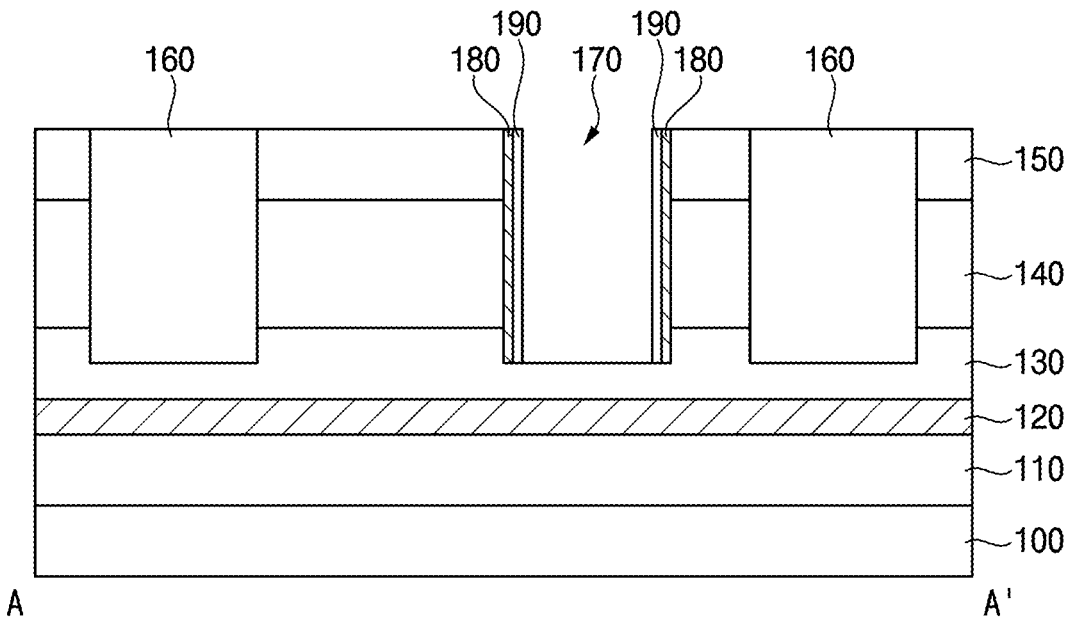
Figure 10:
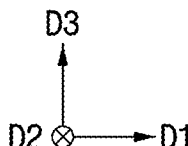

Referring to FIGS. 9 and 10, a conductive layer may be formed, e.g., conformally, on a sidewall and a bottom of the second opening 170, and on upper surfaces of the third insulating interlayer 150 and the second sacrificial layer 160. An anisotropic etching may be performed to remove portions of the conductive layer and to form the conductive pattern 180, e.g., only, on the sidewall of the second opening 170.

A first gate insulation layer may be formed, e.g., conformally, on the bottom of the second opening 170, an inner sidewall and an upper surface of the conductive pattern 180, and upper surfaces of the third insulating interlayer 150 and the second sacrificial layer 160. An anisotropic etching may be performed to remove portions of the first gate insulation layer and to form the first gate insulation pattern 190, e.g., only, on the inner sidewall of the conductive pattern 180.

Thus, each of the conductive pattern 180 and the first gate insulation pattern 190 may have a shape of a hollow cylinder. For example, referring to FIGS. 9 and 10, the conductive pattern 180 may have a shape of a hollow cylinder completely and continuously covering an inner sidewall of each second opening 170, and the first gate insulation pattern 190 may have a shape of a hollow cylinder completely and continuously covering the inner sidewall of the conductive pattern 180, e.g., so conductive pattern 180 completely separates the inner sidewall of the second opening 170 and the first gate insulation pattern 190.

Figure 11:
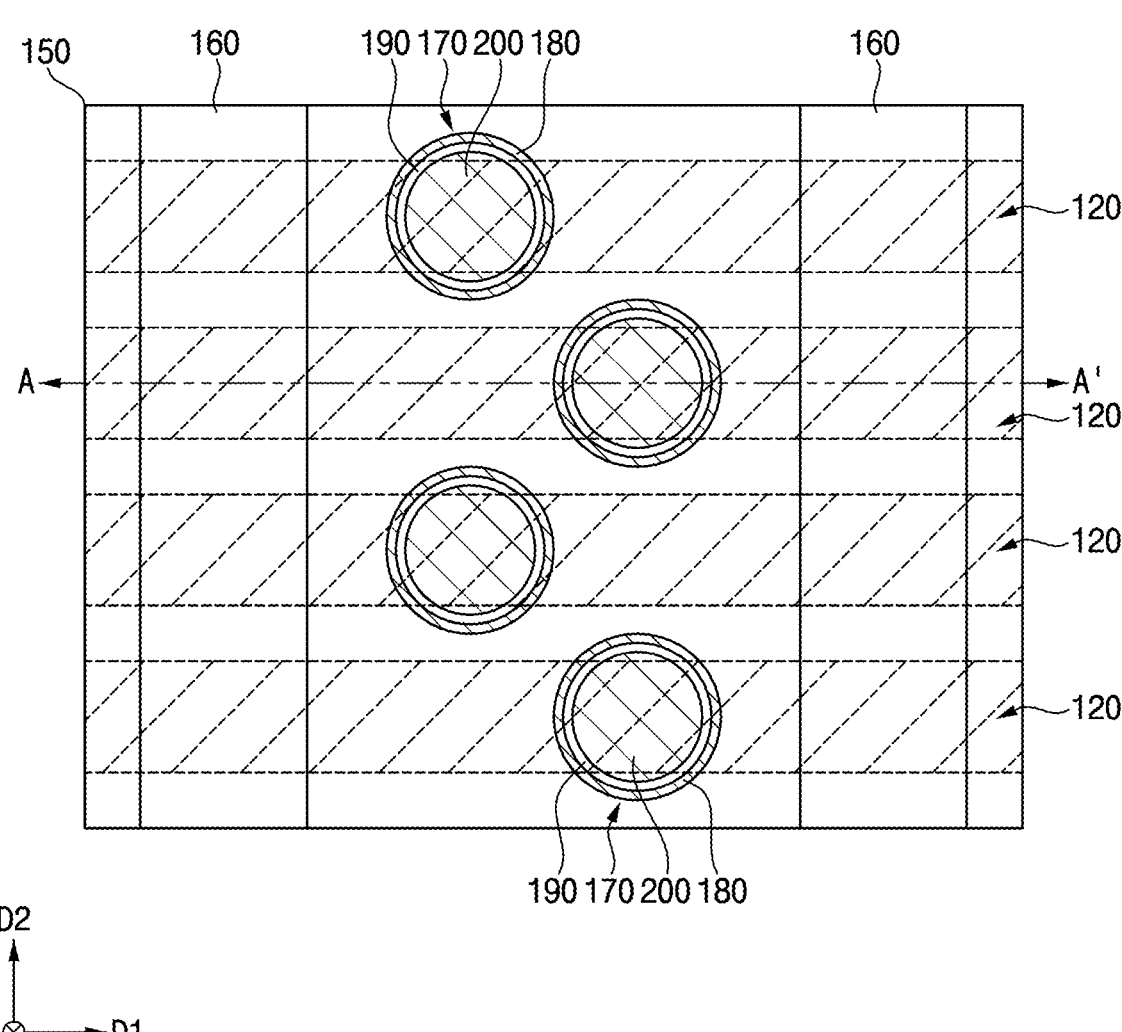
Figure 12:
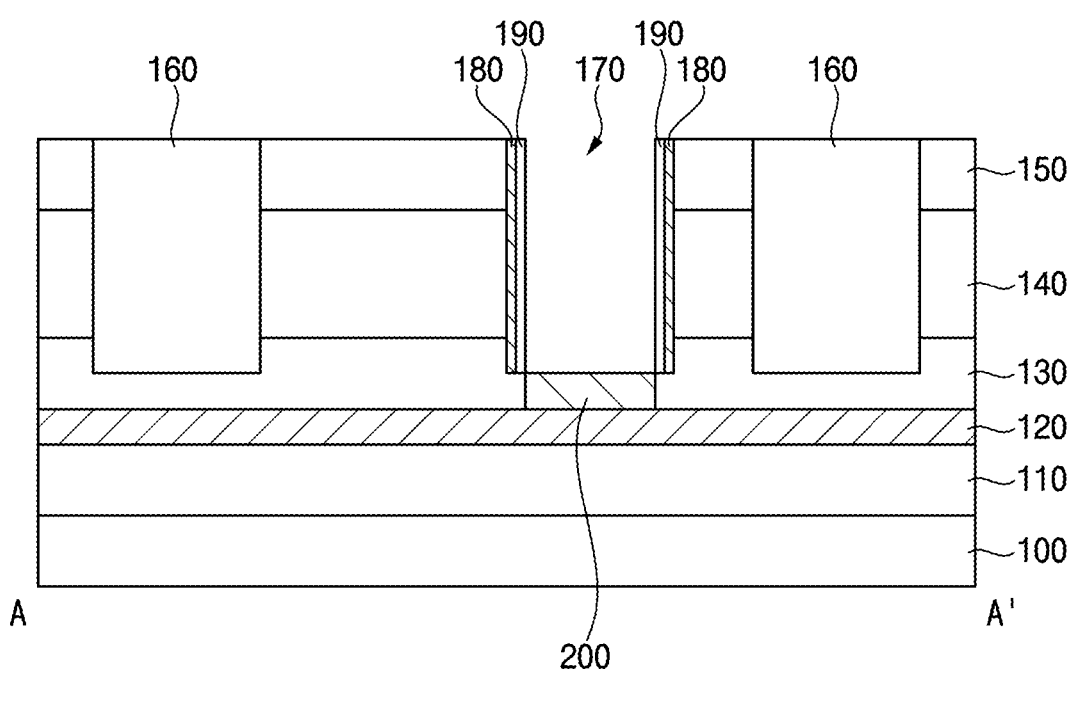
Figure 12:
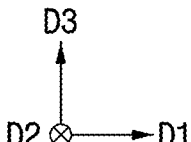

Referring to FIGS. 11 and 12, a portion of the second insulating interlayer 130 under, e.g., exposed by, the second opening 170 may be removed by an etching process to form a third opening exposing an upper surface of the first wiring 120. The first source/drain pattern 200 may be formed in the third opening.

In example embodiments, the third opening may have a shape corresponding to the shape of the second opening 170, and a plurality of third openings may be arranged in the first and second directions D1 and D2. For example, the width of the third opening may correspond to a distance between facing surfaces of the first gate insulation pattern 190 within the second opening 170.

The first source/drain pattern 200 may be formed by forming a first source/drain layer on the upper surface of the first wiring 120 exposed by the third opening, the upper surface of the first gate insulation pattern 190, and the upper surfaces of the conductive pattern 180, the third insulating interlayer 150 and the second sacrificial layer 160. Then, the first source/drain layer may be planarized, e.g., by a chemical mechanical polishing (CMP) process, until the upper surface of the third insulating interlayer 150 is exposed. An upper portion of the first source/drain layer may be, e.g., completely, removed from the second opening 170, e.g., by an etch back process, such that first source/drain pattern 200 fills only the third opening.

Thus, the first source/drain pattern 200 may have a shape corresponding to the shape of the third opening, and a plurality of first source/drain patterns 200 may be arranged in the first and second directions D1 and D2. In example embodiments, the first source/drain pattern 200 may include polysilicon doped with n-type impurities, e.g., phosphorus, arsenic, etc., or polysilicon doped with p-type impurities, e.g., boron, gallium, etc.

Figure 13:
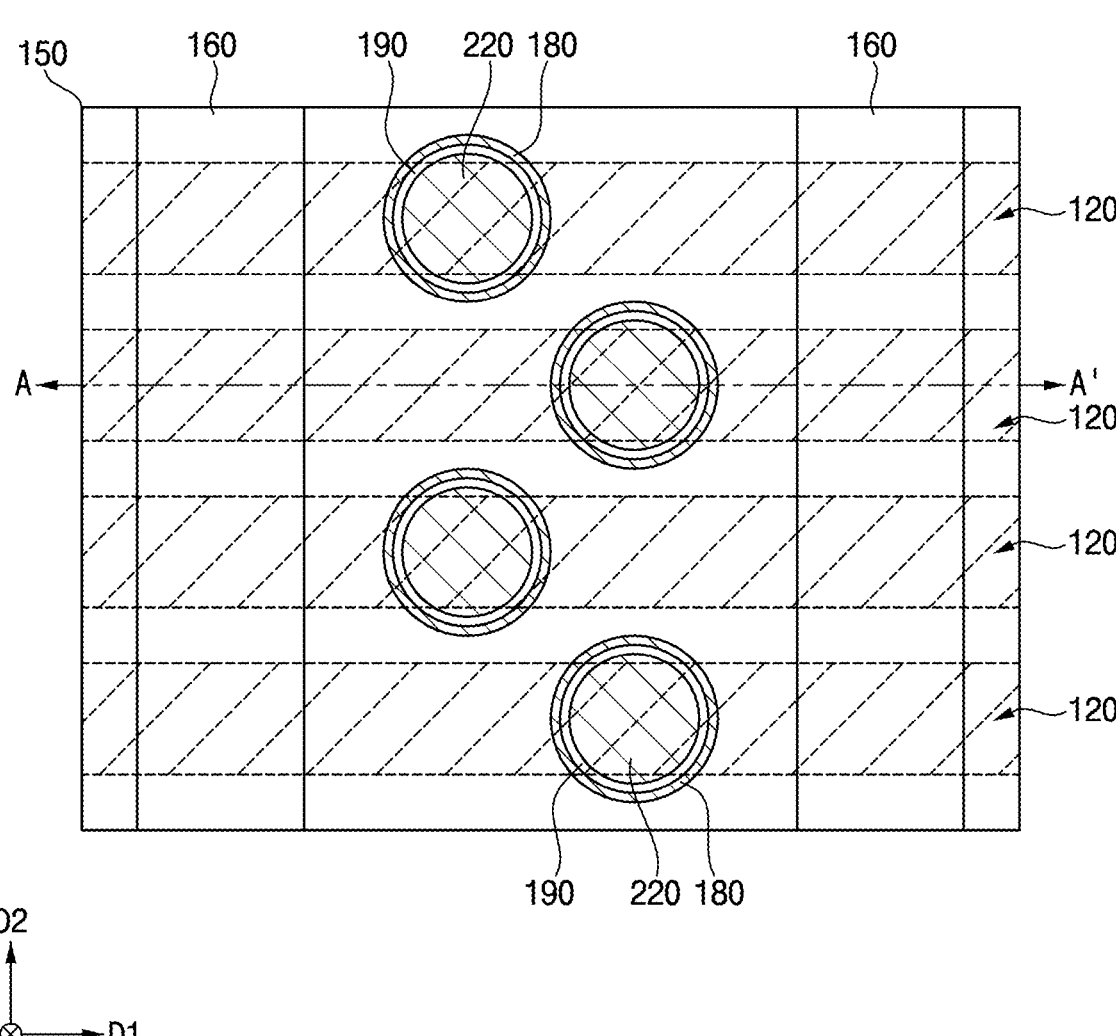
Figure 14:
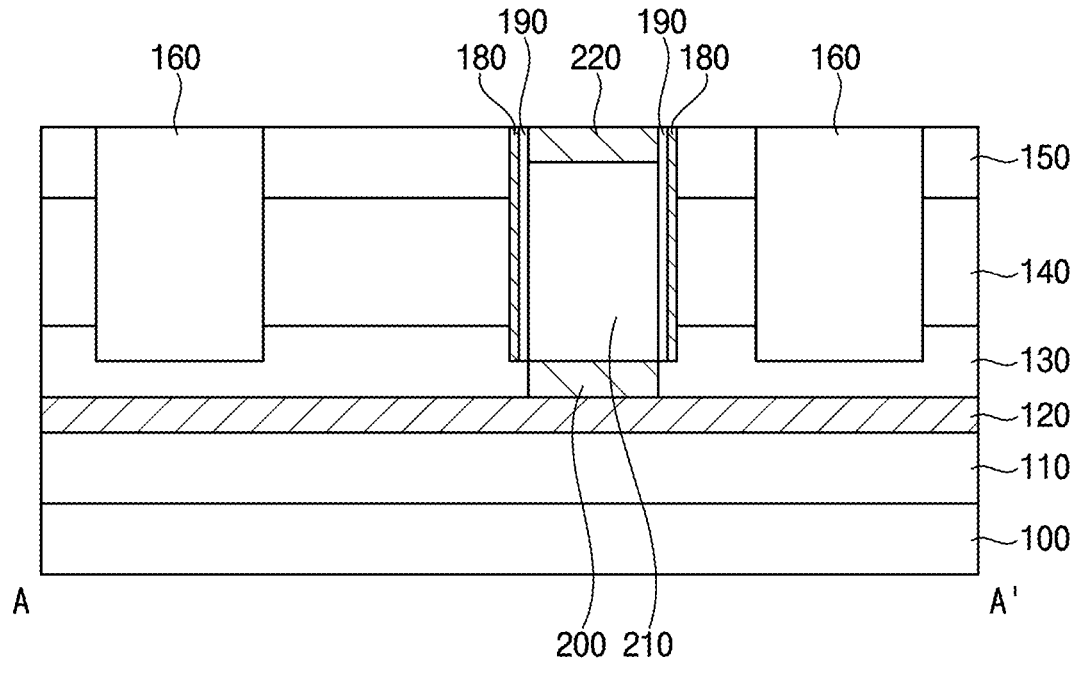
Figure 14:
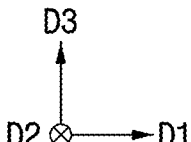

Referring to FIGS. 13 and 14, the first channel 210 may be formed in the second opening 170, and impurities may be doped into an upper portion of the first channel 210 to form the second source/drain pattern 220.

The first channel 210 may be formed by forming a first channel layer on the first source/drain pattern 200, the first gate insulation pattern 190, the conductive pattern 180, the third insulating interlayer 150, and the second sacrificial layer 160 to fill the second opening 170, and planarizing the first channel layer by, e.g., a CMP process until the upper surface of the third insulating interlayer 150 is exposed. The first channel 210 may include, e.g., polysilicon.

Thus, the first channel 210 may have a shape corresponding to the shape of the second opening 170, and a plurality of first channels 210 may be arranged in the first and second directions D1 and D2.

In example embodiments, the second source/drain pattern 220 may be formed by implanting impurities into an upper portion of the first channel 210 including a semiconductor material, e.g., polysilicon, silicon-germanium, etc. Thus, the second source/drain pattern 220 may include polysilicon doped with n-type impurities, e.g., phosphorus, arsenic, etc., or silicon-germanium doped with p-type impurities, e.g., boron, gallium, etc.

Alternatively, the second source/drain pattern 220 may be formed by removing an upper portion of the first channel 210 to form a first recess, and filling the first recess with, e.g., an oxide semiconductor material.

The second source/drain pattern 220 may have a shape corresponding to the shape of the first channel 210, and a plurality of second source/drain patterns 220 may be arranged in the first and second directions D1 and D2.

Figure 15:
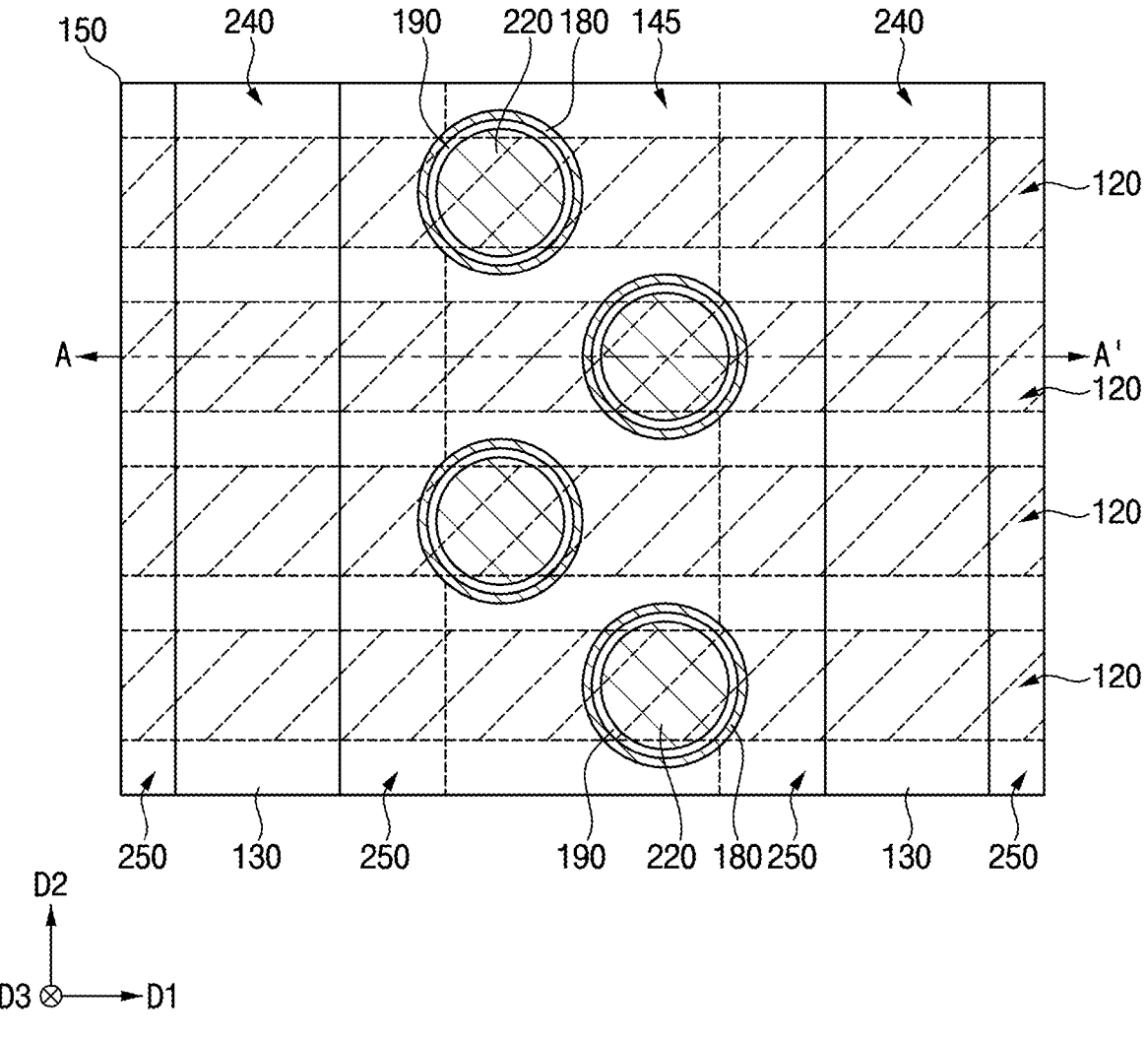
Figure 16:
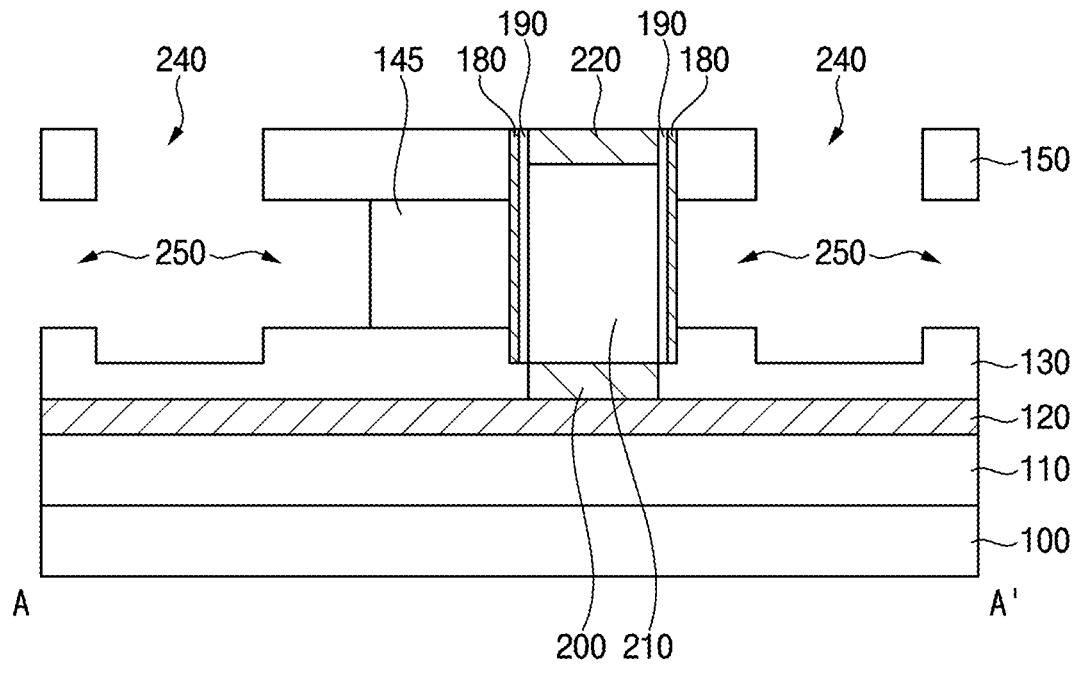
Figure 16:
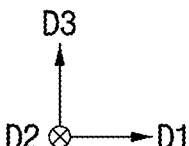

Referring to FIGS. 15 and 16, the second sacrificial layer 160 may be removed to form a fourth opening 240, and a portion of the first sacrificial layer 140 adjacent to the fourth opening 240 may be removed to form a gap 250 exposing an outer sidewall of the conductive pattern 180. For example, referring to FIG. 16, the fourth opening 240 may extend through the entire third insulating interlayer 150 and a portion of the second insulating interlayer 130 (i.e., from where the second sacrificial layer 160 has been removed), and the gap 250 may be formed at lateral sides of the fourth opening 240 and in fluid communication with the fourth opening 240 (e.g., the gap 250 may be under the third insulating interlayer 150 and between the fourth opening 240 and the conductive pattern 180).

In example embodiments, the gap 250 may be formed by performing a wet etching process on the first sacrificial layer 140, and a portion of the first sacrificial layer 140 within a given distance in the first direction D1 from the fourth opening 240 may be removed to form the gap 250. The first sacrificial layer 140 may not be entirely removed by the wet etching process, and a portion of the first sacrificial layer 140 remains as a first insulation pattern 145. Accordingly, the outer sidewall of the conductive pattern 180 may not be entirely exposed, but only a portion of the outer sidewall of the conductive pattern 180 may be exposed by the gap 250.

Figure 17:
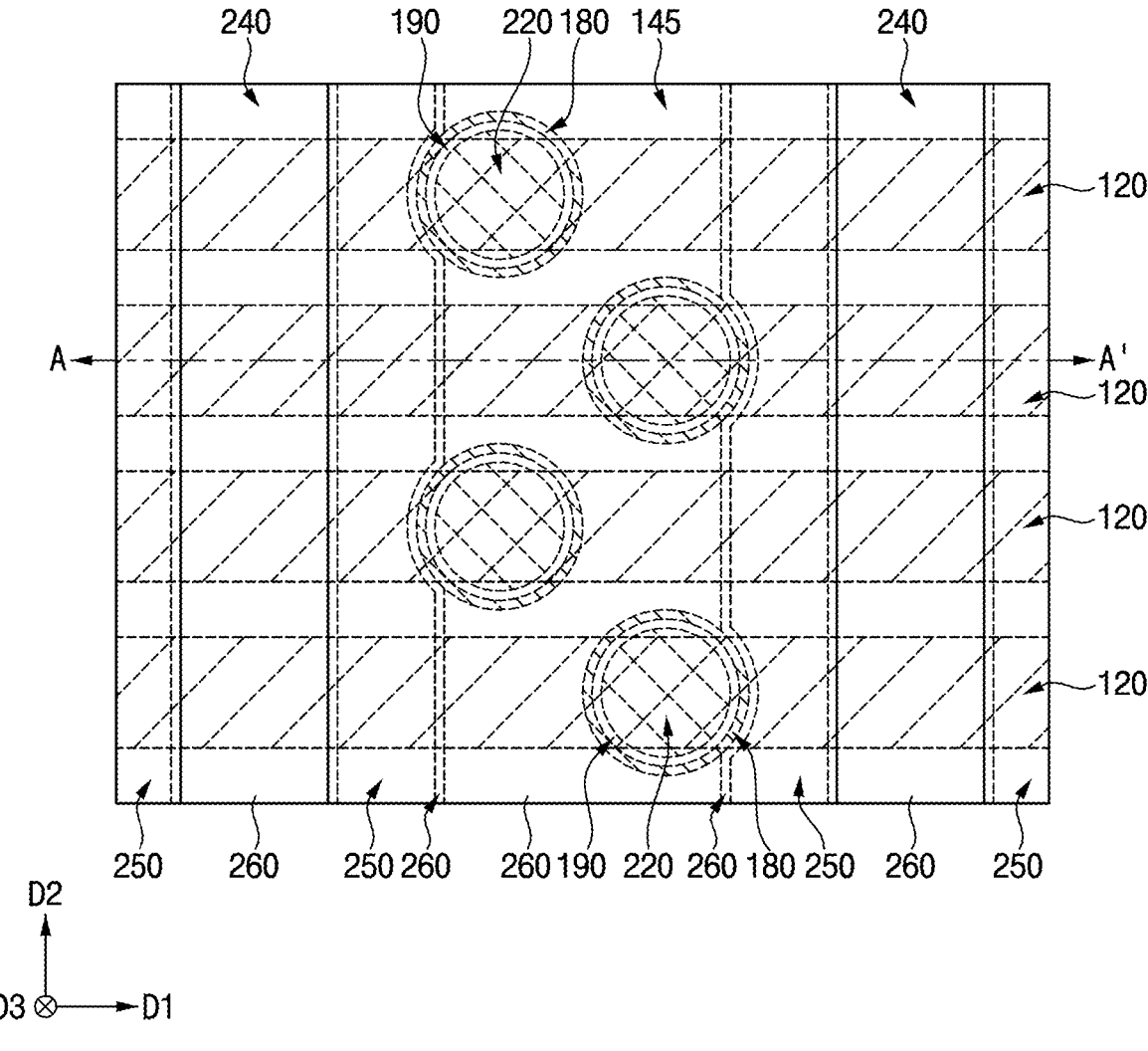
Figure 18:
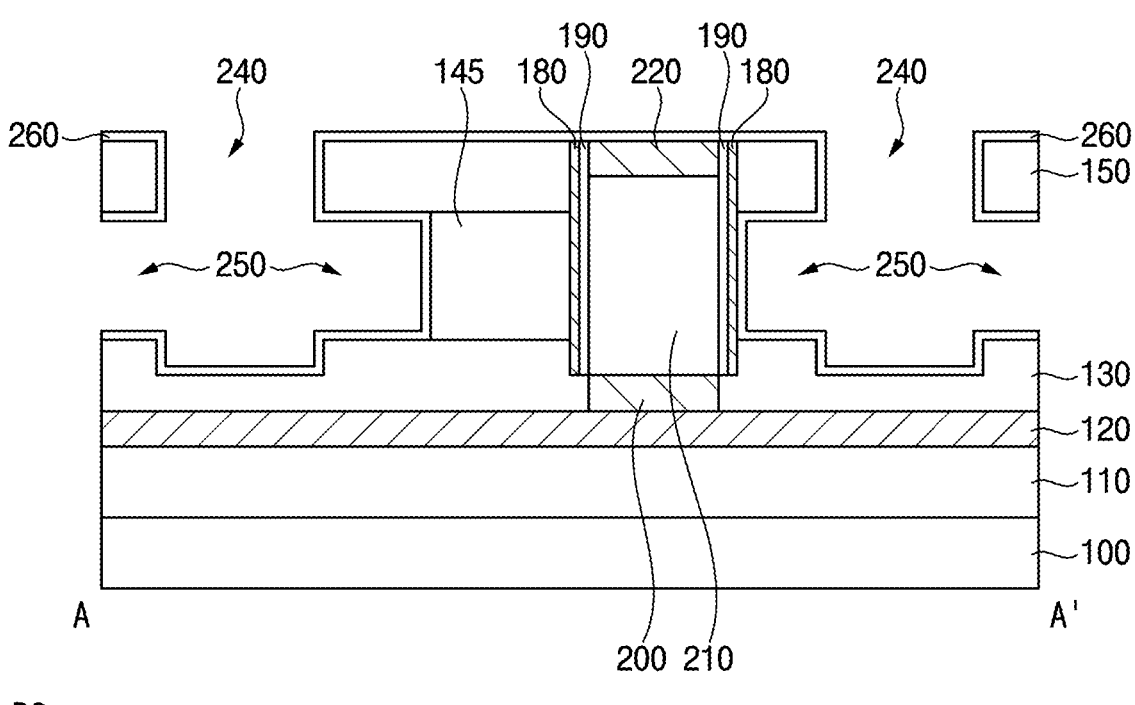
Figure 18:
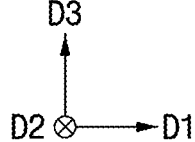

Referring to FIGS. 17 and 18, a ferroelectric layer 260 may be formed on inner walls of the fourth opening 240 and the gap 250, an upper surface of the second source/drain pattern 220, and the upper surfaces of the first gate insulation pattern 190, the conductive pattern 180, and the third insulating interlayer 150. In example embodiments, the ferroelectric layer 260 may be formed conformally by a deposition process, e.g., a chemical vapor deposition (CVD) process, an atomic layer deposition (ALD) process, etc. The ferroelectric layer 260 may, e.g., directly, contact the portion of the outer sidewall of the conductive pattern 180 exposed by the gap 250.

Figure 19:
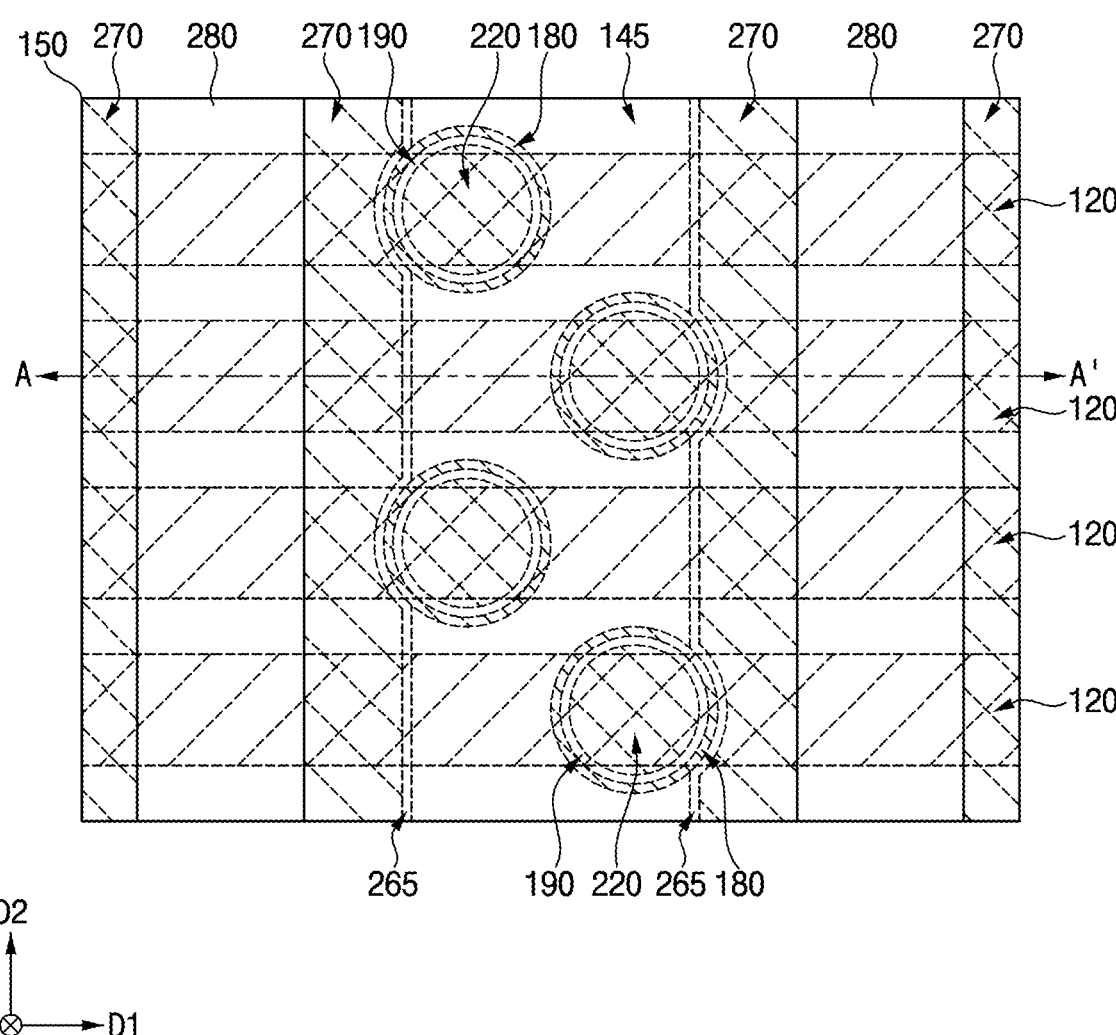
Figure 20:
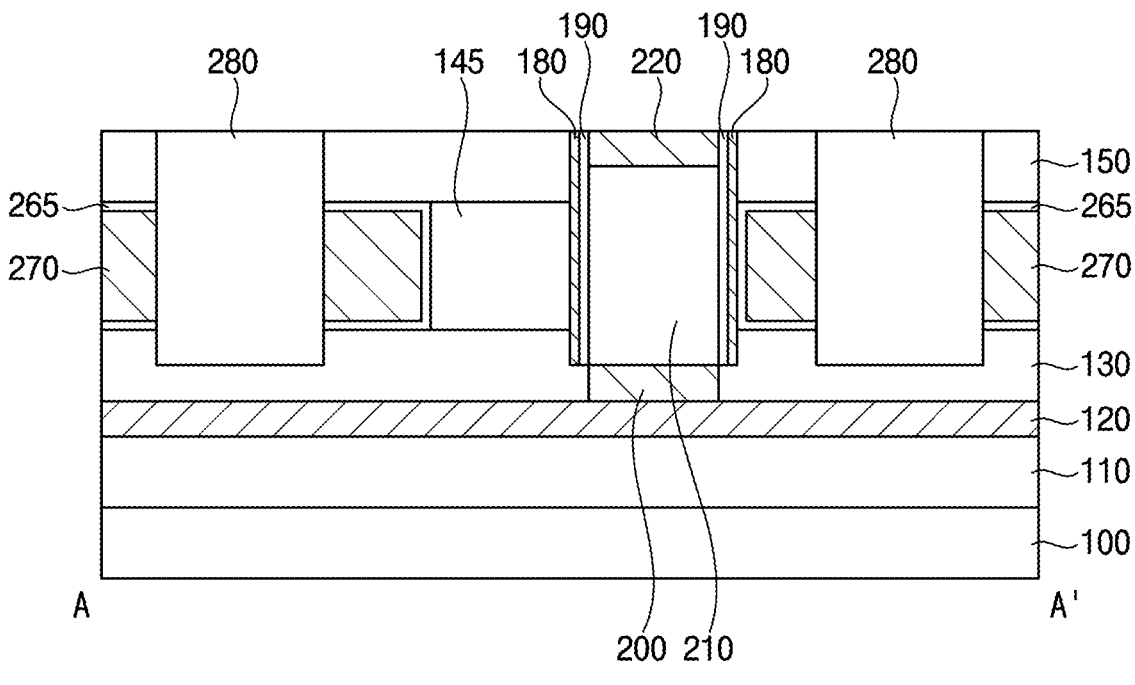
Figure 20:
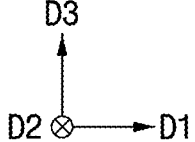

Referring to FIGS. 19 and 20, a second wiring layer may be formed on the ferroelectric layer 260 to fill the gap 250, and a wet etching process may be performed on the second wiring layer to form the second wiring 270 in the gap 250. For example, as illustrated in FIG. 20, lateral sidewalls of the second wiring 270 may be coplanar with those of the third insulating interlayer 150.

During the wet etching process, a portion of the ferroelectric layer 260 on the upper surfaces of the second source/drain pattern 220, the first gate insulation pattern 190, the conductive pattern 180, and the third insulating interlayer 150, and the sidewall and the bottom of the fourth opening 240 may also be removed. Thus, the ferroelectric pattern 265 contacting the inner wall of the gap 250, the portion of the outer sidewall of the conductive pattern 180, and the sidewall of the first insulation pattern 145 and covering lower and upper surfaces and a sidewall facing the conductive pattern 180 may be formed.

In example embodiments, the second wiring 270 may extend in the second direction D2 at each of opposite sides in the first direction D1. In example embodiments, the second wiring 270 may serve as a word line of the 3D ferroelectric memory device.

A second insulation layer may be formed on the second insulating interlayer 130, the second source/drain pattern 220, the first gate insulation pattern 190, the conductive pattern 180, and the third insulating interlayer 150 to fill the fourth opening 240, and may be planarized until the upper surface of the third insulating interlayer 150 is exposed to form the second insulation pattern 280 in the fourth opening 240. The second insulation pattern 280 may extend in the second direction D2, and a plurality of second insulation patterns 280 may be spaced apart from each other in the first direction D1.

Referring to FIGS. 2A and 3A again, the fourth insulating interlayer 290 may be formed on the second source/drain pattern 220, the first gate insulation pattern 190, the conductive pattern 180, the third insulating interlayer 150, and the second insulation pattern 280, and the first contact plug 300 may be formed through the fourth insulating interlayer 290 to contact the upper surface of the second source/drain pattern 220. The first contact plug 300 may have a shape of, e.g., a circle, an ellipse, a polygon, a polygon with rounded corners, etc., in a plan view, and a plurality of first contact plugs 300 may be arranged in the first and second directions D1 and D2.

The fifth insulating interlayer 310 may be formed on the fourth insulating interlayer 290 and the first contact plug 300. A fifth opening may be formed through the fifth insulating interlayer 310 to expose an upper surface of the first contact plug 300, and the third wiring 320 may be formed in the fifth opening.

In example embodiments, the third wiring 320 may extend in the first direction D1, and may commonly contact the upper surfaces of the first contact plugs 300 disposed in the first direction D1. A plurality of third wirings 320 may be spaced apart from each other in the second direction D2. In example embodiments, at least a portion of each of the third wirings 320 may overlap a corresponding ones of the first wirings 120 in the third direction D3. In example embodiments, the third wiring 320 may serve as a source line of the 3D ferroelectric memory device.

By the above processes, the fabrication of the 3D ferroelectric memory device may be completed.

As discussed above, the second insulating interlayer 130, the first sacrificial layer 140, and the third insulating interlayer 150 may be sequentially stacked in the third direction D3, the second sacrificial layer 160 and the second opening 170 may be formed partially therethrough, and the conductive pattern 180, the first gate insulation pattern 190, and the first channel 210 may be formed in the second opening 170. The second sacrificial layer 160 may be removed to form the fourth opening 240, the portion of the first sacrificial layer 140 adjacent to the fourth opening 240 may be removed to form the gap 250 exposing the portion of the outer sidewall of the conductive pattern 180, the ferroelectric pattern 265 may be formed to contact the portion of the outer sidewall of the conductive pattern 180, and the second wiring 270 of which lower and upper surfaces and the sidewall may be covered by the ferroelectric pattern 265 may be formed.

Thus, in the 3D ferroelectric memory device, when compared to the area of the portion of the ferroelectric pattern 265 between and contacting the second wiring 270 and the conductive pattern 180, the area of the portion of the first gate insulation pattern 190 between and contacting the conductive pattern 180 and the first channel 210 may be greater.

Figure 21:
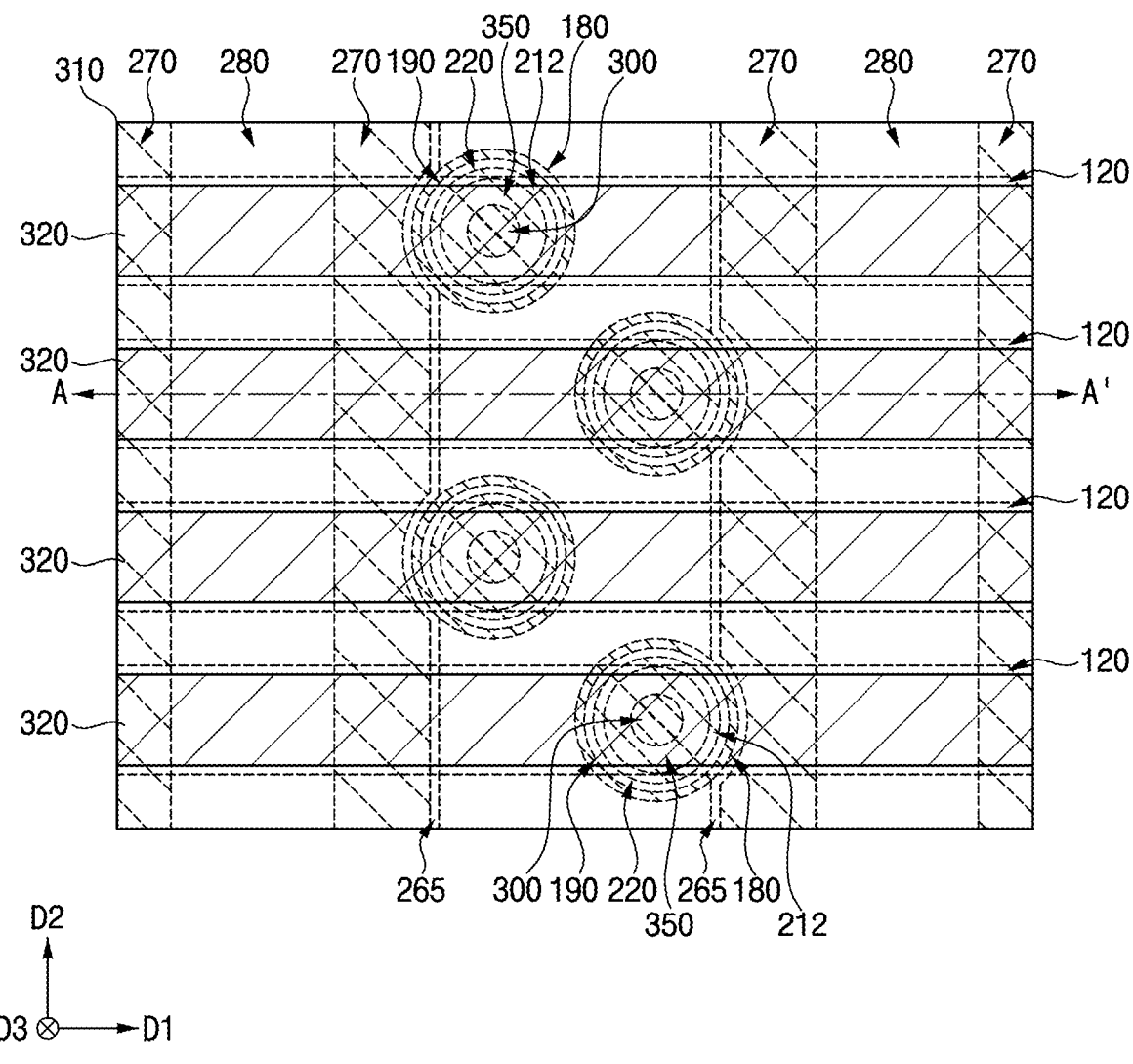
FIGS. 21 and 22 are a plan view and a cross-sectional view illustrating a three-dimensional ferroelectric memory device in accordance with example embodiments.
Figure 22:
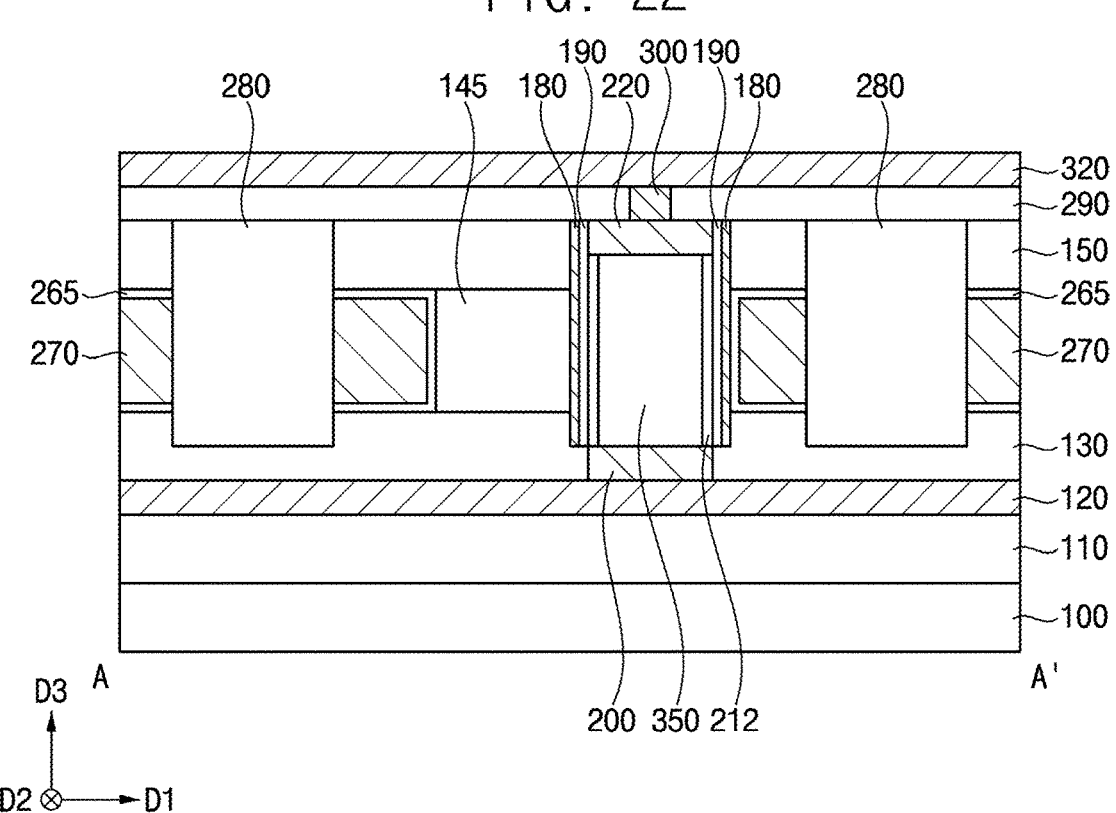

FIGS. 21 and 22 are a plan view and a cross-sectional view illustrating a 3D ferroelectric memory device in accordance with example embodiments. FIGS. 21 and 22 correspond to FIGS. 2A and 3A, respectively. The embodiment of FIGS. 21 and 22 is substantially the same as or similar to that of FIGS. 1 to 3, except for including a second channel with a filling instead of the first channel, and thus, repeated explanations are omitted herein.

Referring to FIGS. 21 and 22, the pillar structure may further include a filling pattern 350 extending in the third direction D3, and a second channel 212 covering a sidewall of the filling pattern 350 may be formed. That is, the second channel 212 may have a shape of a hollow cylinder, and may surround the filling pattern 350. The filling pattern 350 may include an oxide, e.g., silicon oxide.

Figure 23:
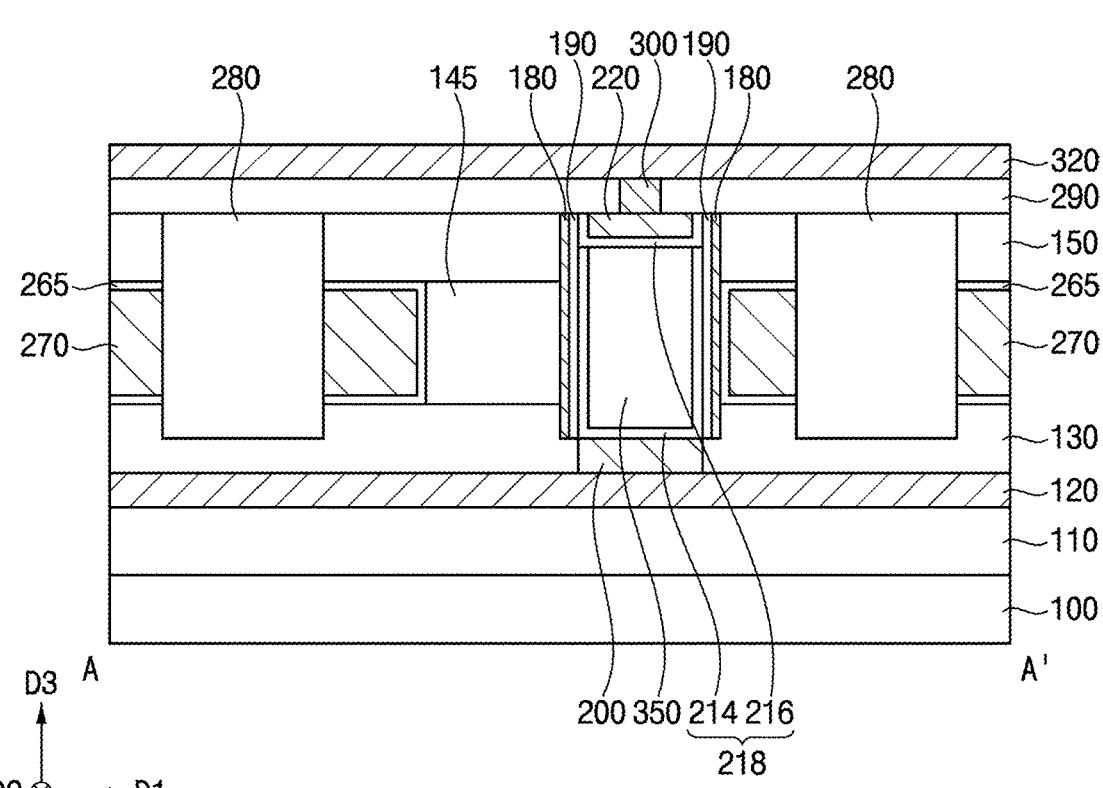
FIG. 23 is a cross-sectional view illustrating a three-dimensional ferroelectric memory device in accordance with example embodiments.

FIG. 23 is a cross-sectional view illustrating a 3D ferroelectric memory device in accordance with example embodiments. FIG. 23 corresponds to FIG. 3A. The embodiment of FIG. 23 is substantially the same as or similar to that of FIGS. 1 to 3, except for including third and fourth channels with a filling pattern, instead of the first channel, and thus, repeated explanations are omitted herein.

Referring to FIG. 23, the pillar structure may further include the filling pattern 350, and a lower surface and a sidewall of the filling pattern 350 may be covered by a third channel 214. In example embodiments, the third channel 214 may have a shape of a cup.

A fourth channel 216 may be formed on upper surfaces of the filling pattern 350 and the third channel 214, and the lower surface and the sidewall of the second source/drain pattern 220 may be covered by the fourth channel 216. In example embodiments, the fourth channel 216 may have a shape of a cup.

In example embodiments, each of the third and fourth channels 214 and 216 may include a two-dimensional (2D) material, e.g., $MoS_2$, $MoSe_2$, $WS_2$, etc.

Figure 24:
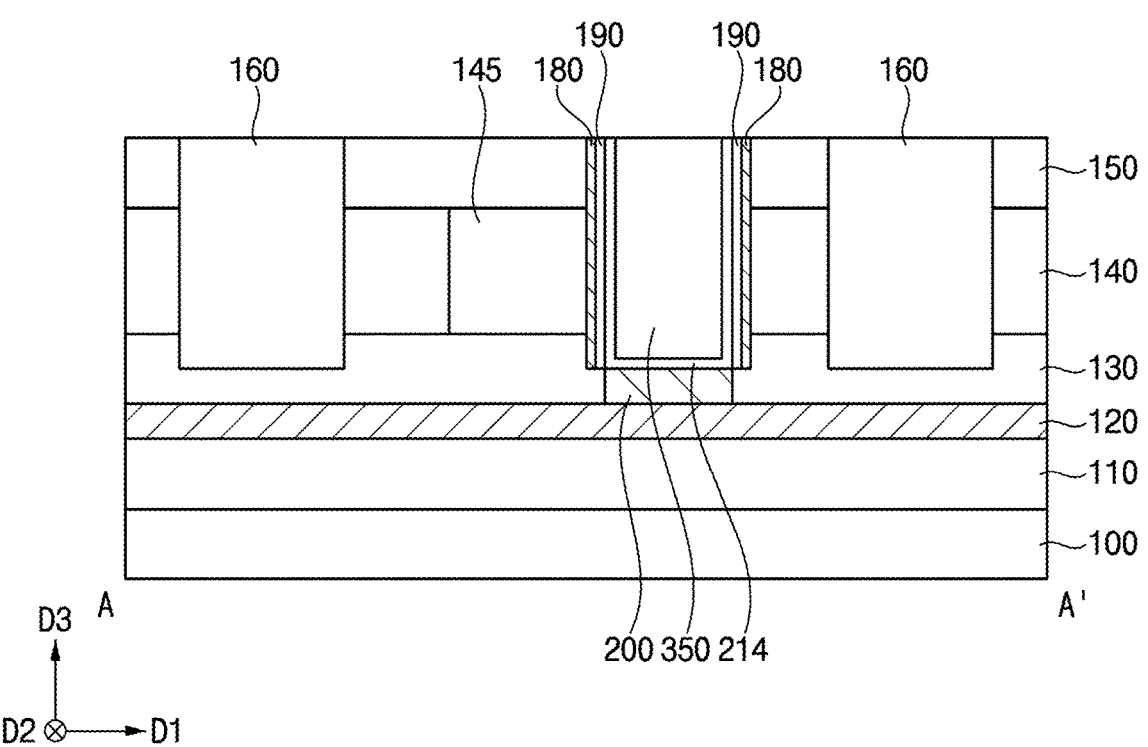
FIGS. 24 and 25 are cross-sectional views illustrating stages in a method of manufacturing a three-dimensional ferroelectric memory device in accordance with example embodiments.
Figure 25:
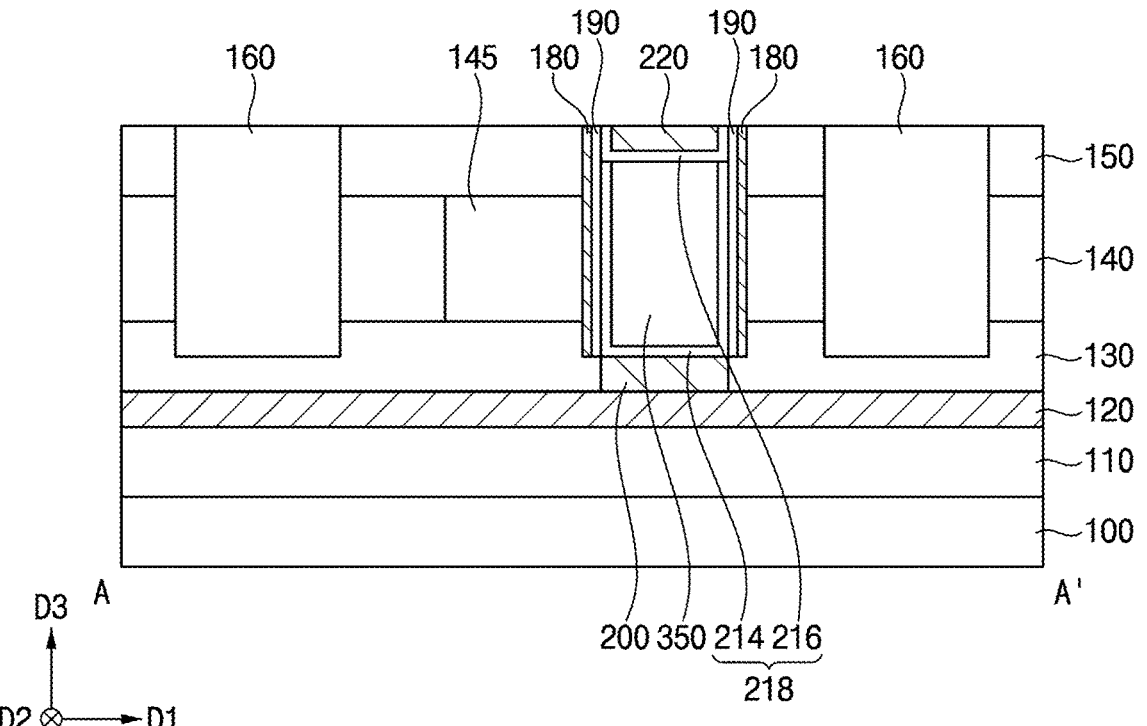

FIGS. 24 and 25 are cross-sectional views illustrating stages in a method of manufacturing a 3D ferroelectric memory device in accordance with example embodiments. The embodiment of FIGS. 24 and 25 includes stages substantially the same as or similar to those illustrated with reference to FIGS. 5 to 20 and FIGS. 1 to 3, and thus, repeated explanations thereon are omitted herein.

Referring to FIG. 24, processes substantially the same as or similar to those illustrated with reference to FIGS. 5 to 12 may be performed, and a third channel layer may be formed on the sidewall and the bottom of the second opening 170, and the upper surfaces of the first gate insulation pattern 190, the conductive pattern 180, the third insulating interlayer 150 and the second sacrificial layer 160. In example embodiments, the third channel layer may include a 2D material. A filling layer may be formed on the third channel layer, and the filling layer and the third channel layer may be planarized to form the filling pattern 350 and the third channel 214, respectively, in the second opening 170.

Referring to FIG. 25, upper portions of the filling pattern 350 and the third channel 214 may be removed by, e.g., an etch back process, to form a second recess, a fourth channel layer may be formed on a sidewall and a bottom of the second recess, and the upper surfaces of the first gate insulation pattern 190, the conductive pattern 180, the third insulating interlayer 150 and the second sacrificial layer 160, and a second source/drain layer may be formed on the fourth channel layer to fill a remaining portion of the second recess. The second source/drain layer and the fourth channel layer may be planarized to form the second source/drain pattern 220 and the fourth channel 216 in the second recess. The fourth channel 216 may cover the lower surface and the sidewall of the second source/drain pattern 220.

In example embodiments, the fourth channel 216 may include a 2D material. Processes substantially the same as or similar to those illustrated with reference to FIGS. 15 to 20 and FIGS. 1 to 3 may be performed to complete the fabrication of the 3D ferroelectric memory device.

Figure 26:
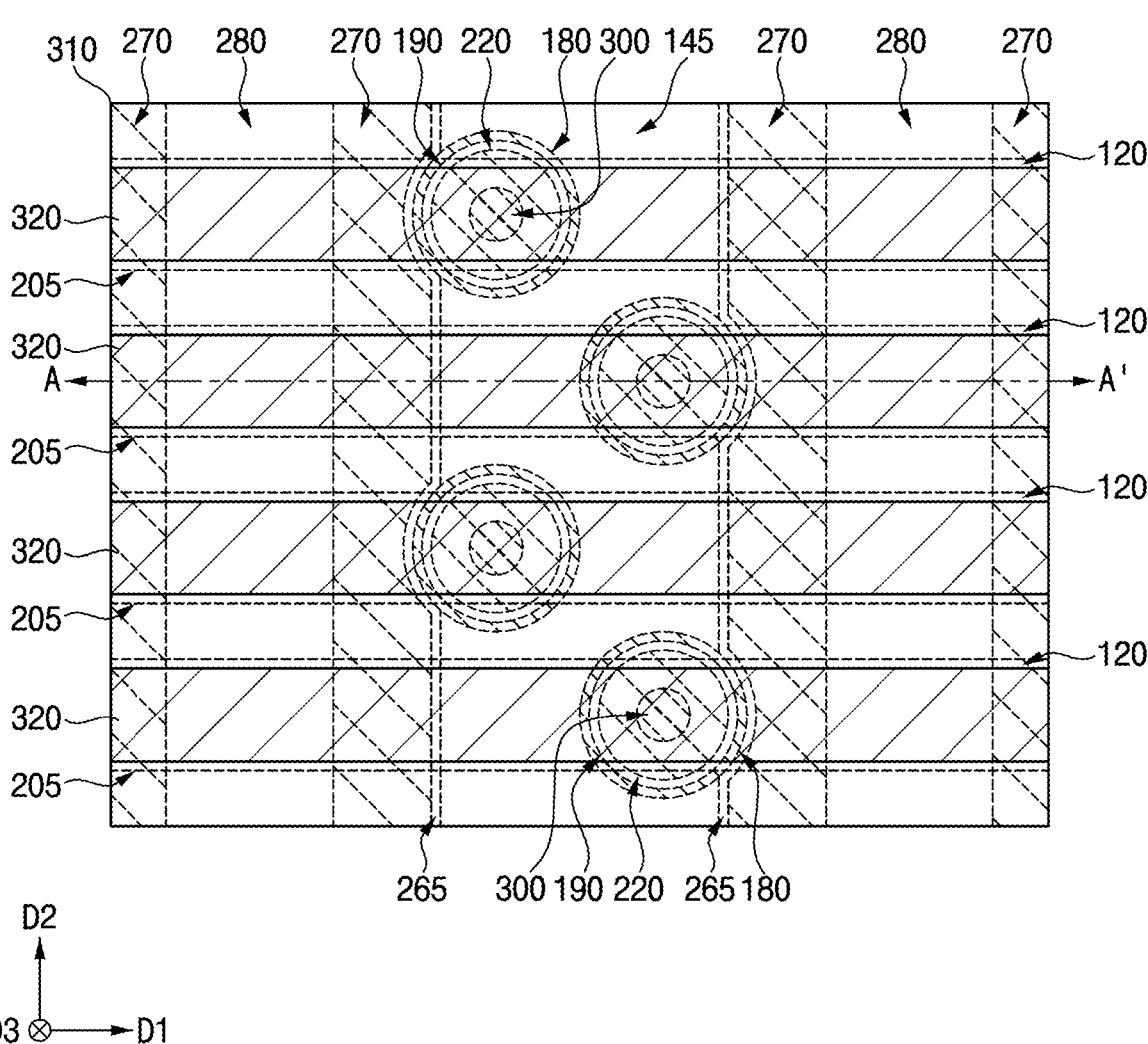
FIGS. 26 and 27 are a plan view and a cross-sectional view illustrating a three-dimensional ferroelectric memory device in accordance with example embodiments.
Figure 27:
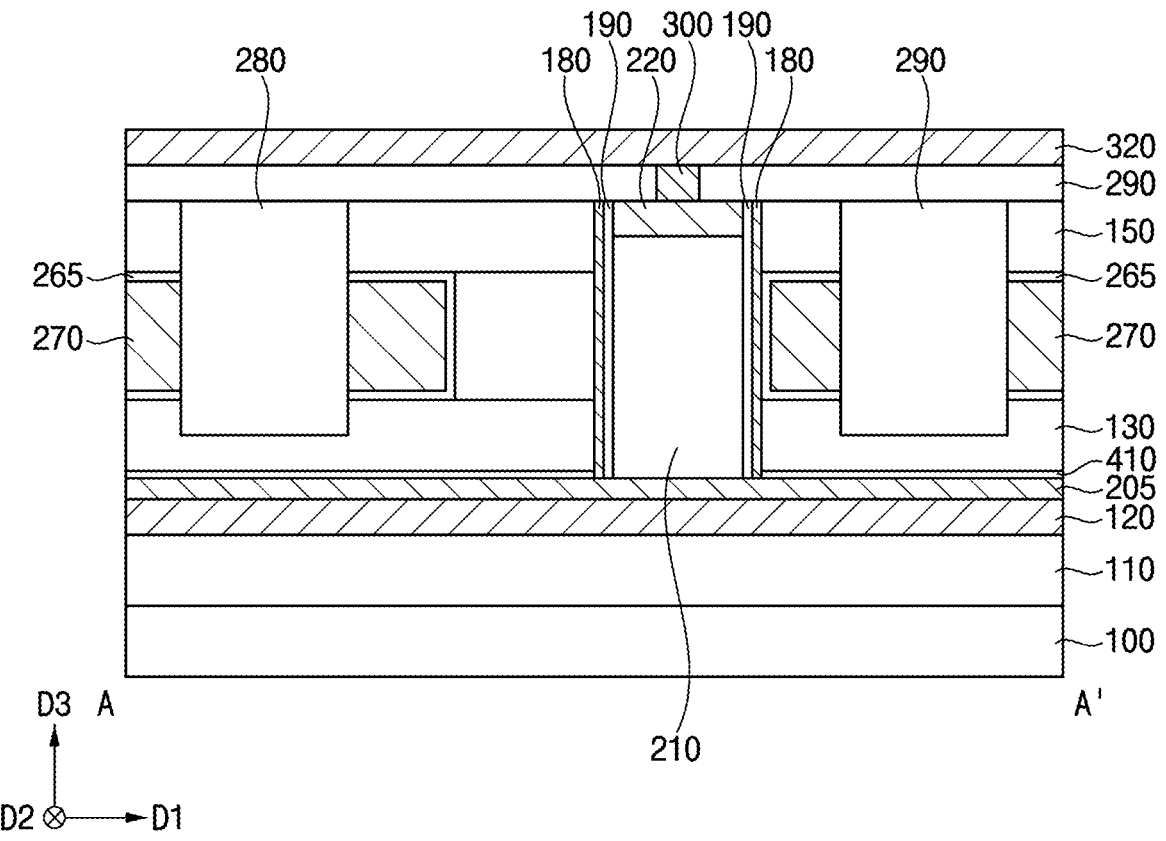

FIGS. 26 and 27 are a plan view and a cross-sectional view illustrating a 3D ferroelectric memory device in accordance with example embodiments. FIGS. 26 and 27 correspond to FIGS. 2A and 3A, respectively. The embodiment of FIGS. 26 and 27 is substantially the same as or similar to that of FIGS. 1 to 3, except for including a third source/drain pattern instead of the first source/drain pattern, and thus, repeated explanations are omitted herein.

Referring to FIGS. 26 and 27, a third source/drain pattern 205 may be formed on the first wiring 120. In example embodiments, the third source/drain pattern 205 may extend in the first direction D1 on the first wiring 120. Alternatively, a plurality of third source/drain patterns 205 may be spaced apart from each other in the first direction D1 on the first wiring 120. The third source/drain pattern 205 may include polysilicon doped with n-type impurities, e.g., phosphorus, arsenic, etc., or polysilicon doped with p-type impurities, e.g., boron, gallium, etc.

Sidewalls of the first wiring 120 and the third source/drain pattern 205 may be covered by a sixth insulating interlayer pattern 400 (refer to FIG. 28) on the first insulating interlayer 110, and an etch stop layer 410 may be further formed on the sixth insulating interlayer pattern 400 and the third source/drain pattern 205. The first channel 210 may extend through the etch stop layer 410, and may contact an upper surface of the third source/drain pattern 205. The sixth insulating interlayer pattern 400 may include an oxide, e.g., silicon oxide, and the etch stop layer 410 may include a metal oxide, e.g., aluminum oxide.

Figure 28:
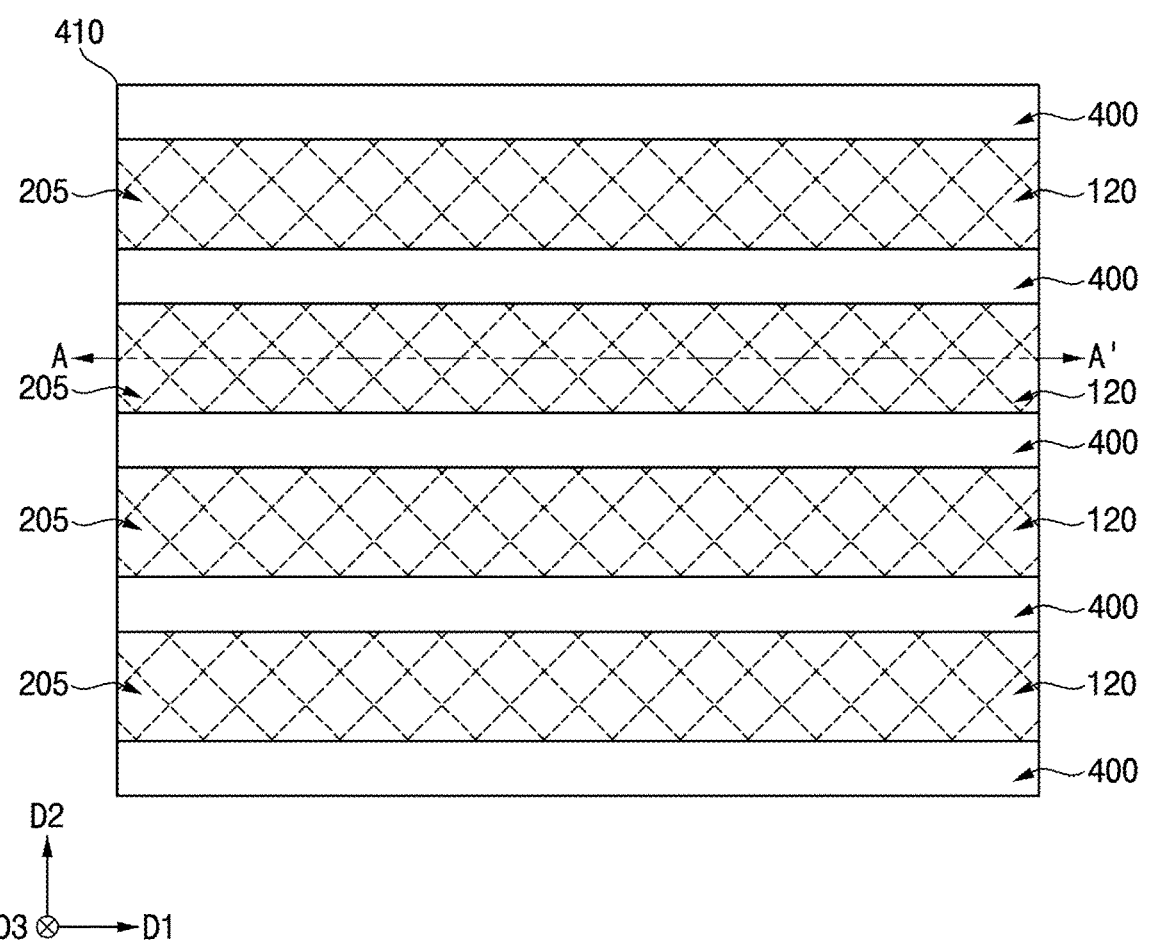
FIGS. 28 and 30 are plan views illustrating stages in a method of manufacturing a three-dimensional ferroelectric memory device in accordance with example embodiments.
Figure 29:
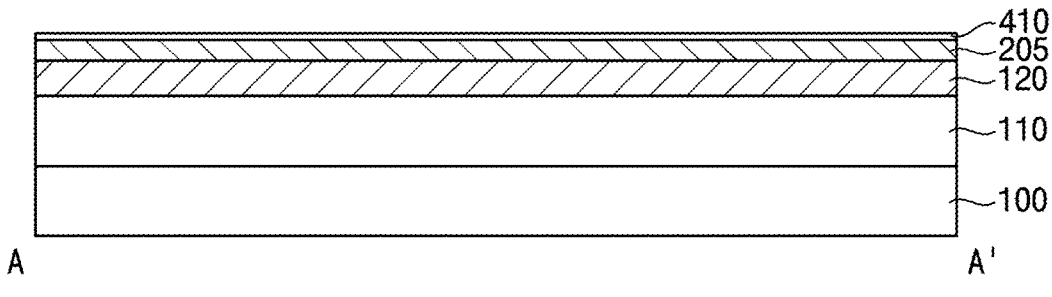
FIGS. 29, 31 and 32 are cross-sectional views taken along lines A-A' of corresponding plan views, respectively.
Figure 29:
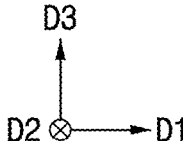
Figure 30:
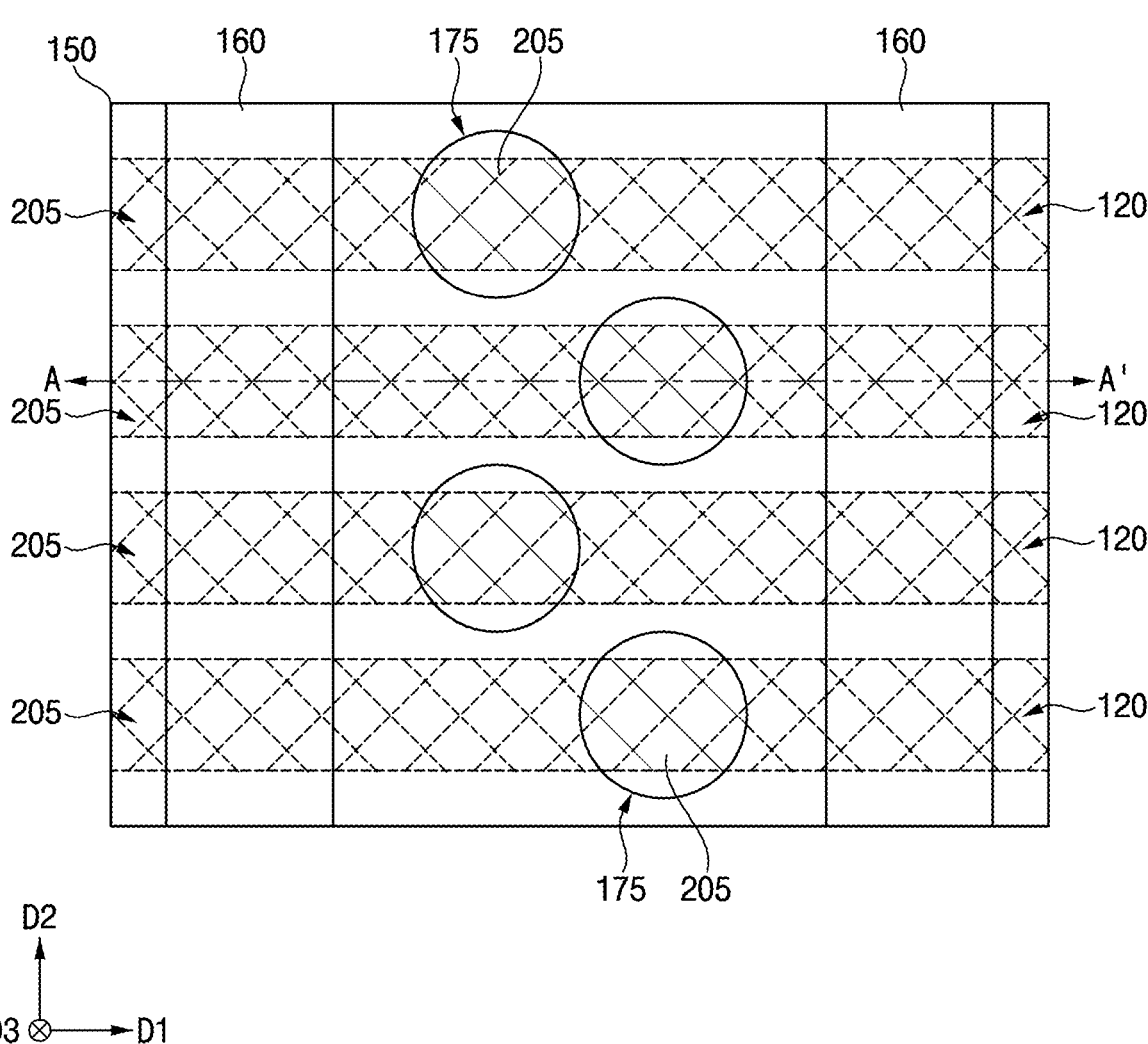
Figure 31:
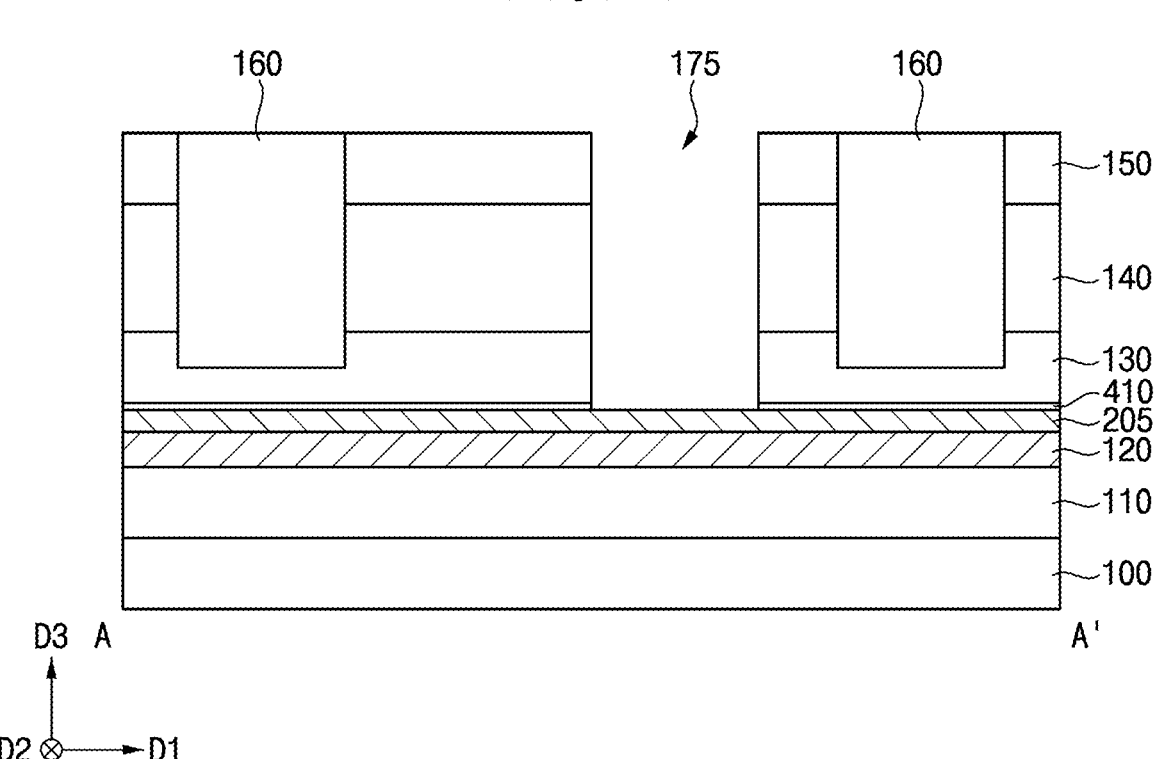
Figure 32:
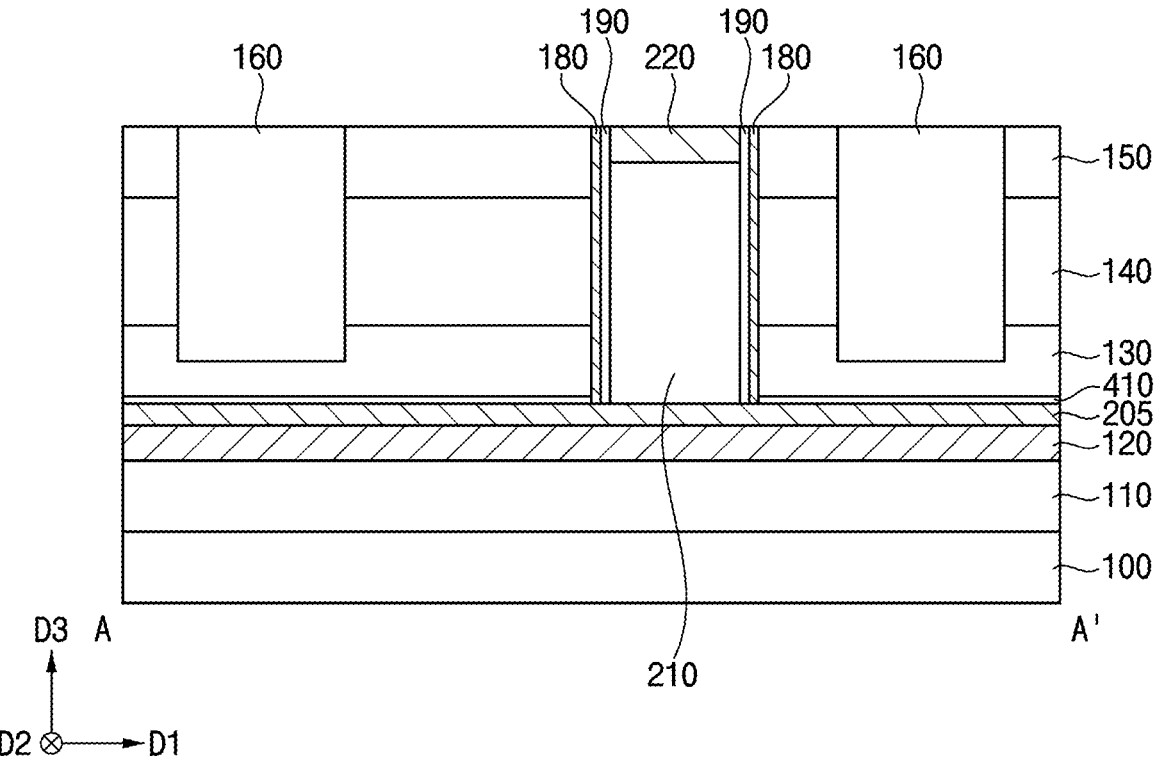

FIGS. 28 and 30 are plan views illustrating stages in a method of manufacturing a 3D ferroelectric memory device in accordance with example embodiments. FIGS. 29, 31 and 32 are cross-sectional views taken along lines A-A' of corresponding plan views, respectively. The embodiment of FIGS. 28-32 includes processes substantially the same as or similar to those illustrated with reference to FIGS. 5 to 20 and FIGS. 1 to 3, and thus, repeated explanations thereon are omitted herein.

Referring to FIGS. 28 and 29, the first insulating interlayer 110, the first wiring layer, and a third source/drain layer may be sequentially stacked on the first substrate 100, the third source/drain layer and the first wiring layer may be patterned to form the first wiring 120 and the third source/drain pattern 205, respectively, each of which may extend in the first direction D1. The sixth insulating interlayer pattern 400 may be formed to cover sidewalls of the first wiring 120 and the third source/drain pattern 205, and an etch stop layer 410 may be formed on the sixth insulating interlayer pattern 400 and the third source/drain pattern 205.

Referring to FIGS. 30 and 31, processes substantially the same as or similar to those illustrated with reference to FIGS. 7 and 8 may be performed, so that the second insulating interlayer 130, the first sacrificial layer 140, and the third insulating interlayer 150 may be sequentially stacked on the etch stop layer 410, and the second sacrificial layer 160 may be formed through the third insulating interlayer 150, the first sacrificial layer 140 and the upper portion of the second insulating interlayer 130. A sixth opening 175 may be formed through the third insulating interlayer 150, the first sacrificial layer 140, the second insulating interlayer 130 and the etch stop layer 410 to expose an upper surface of the third source/drain pattern 205.

Referring to FIG. 32, processes substantially the same as or similar to those illustrated with reference to FIGS. 9 to 14 may be performed so that the conductive pattern 180, the first gate insulation pattern 190, the first channel 210 and the second source/drain pattern 220 may be formed in the sixth opening 175. The lower surface of the first channel 210 may contact the upper surface of the second source/drain pattern 220.

Referring to FIGS. 26 and 27, processes substantially the same as or similar to those illustrated with reference to FIGS. 15 to 20 and FIGS. 1 to 3 may be performed to complete the fabrication of the 3D ferroelectric memory device.

Figure 33:
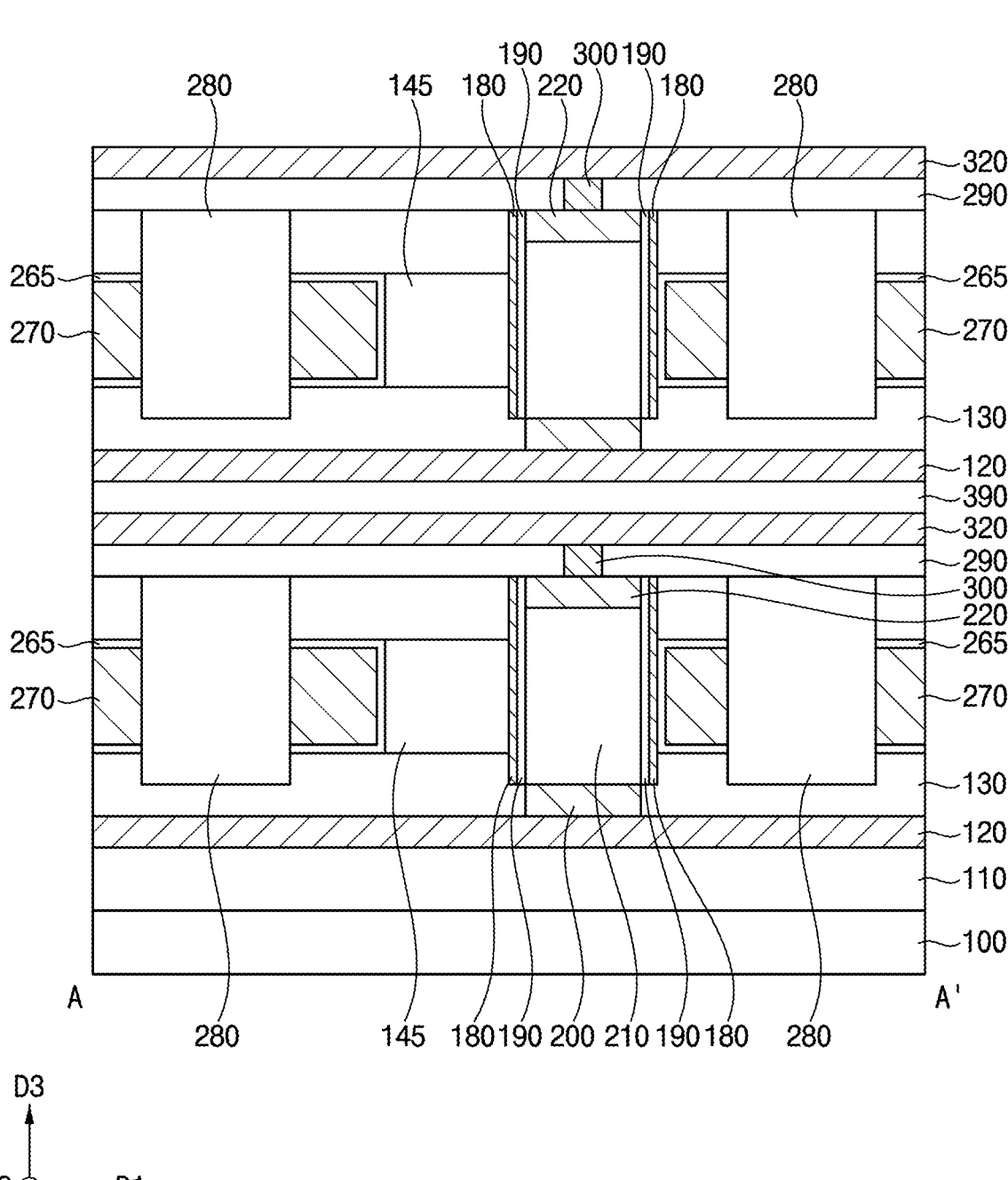
FIG. 33 is a cross-sectional view illustrating a three-dimensional ferroelectric memory device in accordance with example embodiments.

FIG. 33 is a cross-sectional view illustrating a 3D ferroelectric memory device in accordance with example embodiments.

Referring to FIG. 33, a 3D ferroelectric memory device may include a stack structure in which the 3D ferroelectric memory devices shown in FIGS. 1 to 3 are stacked in the third direction D3. That is, a seventh insulating interlayer 390 may be formed on one of the 3D ferroelectric memory devices, the first wiring 120 may be formed on the seventh insulating interlayer 390, and another one of the 3D ferroelectric memory devices may be formed on the first wiring 120. FIG. 33 shows that two 3D ferroelectric memory devices are stacked in the third direction D3, however, embodiments may not be limited thereto, e.g., a plurality of 3D ferroelectric memory devices may be stacked in the third direction D3.

Figure 34:
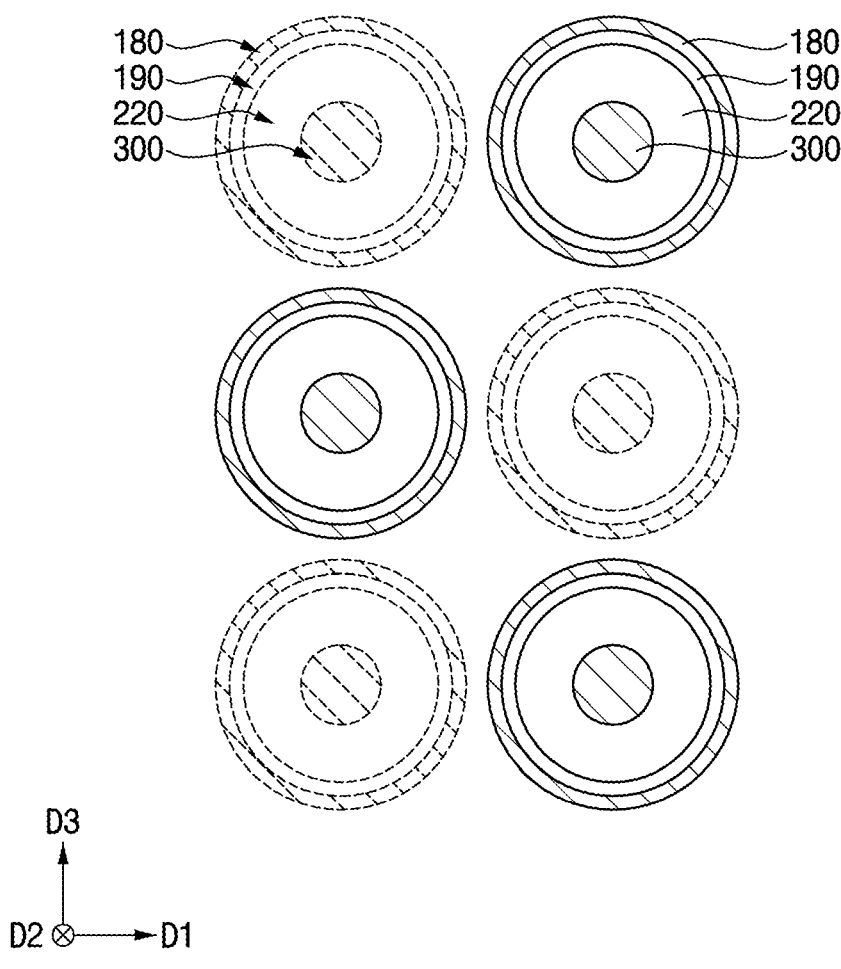
FIG. 34 is a plan view illustrating a three-dimensional ferroelectric memory device in accordance with example embodiments.
Figure 35:
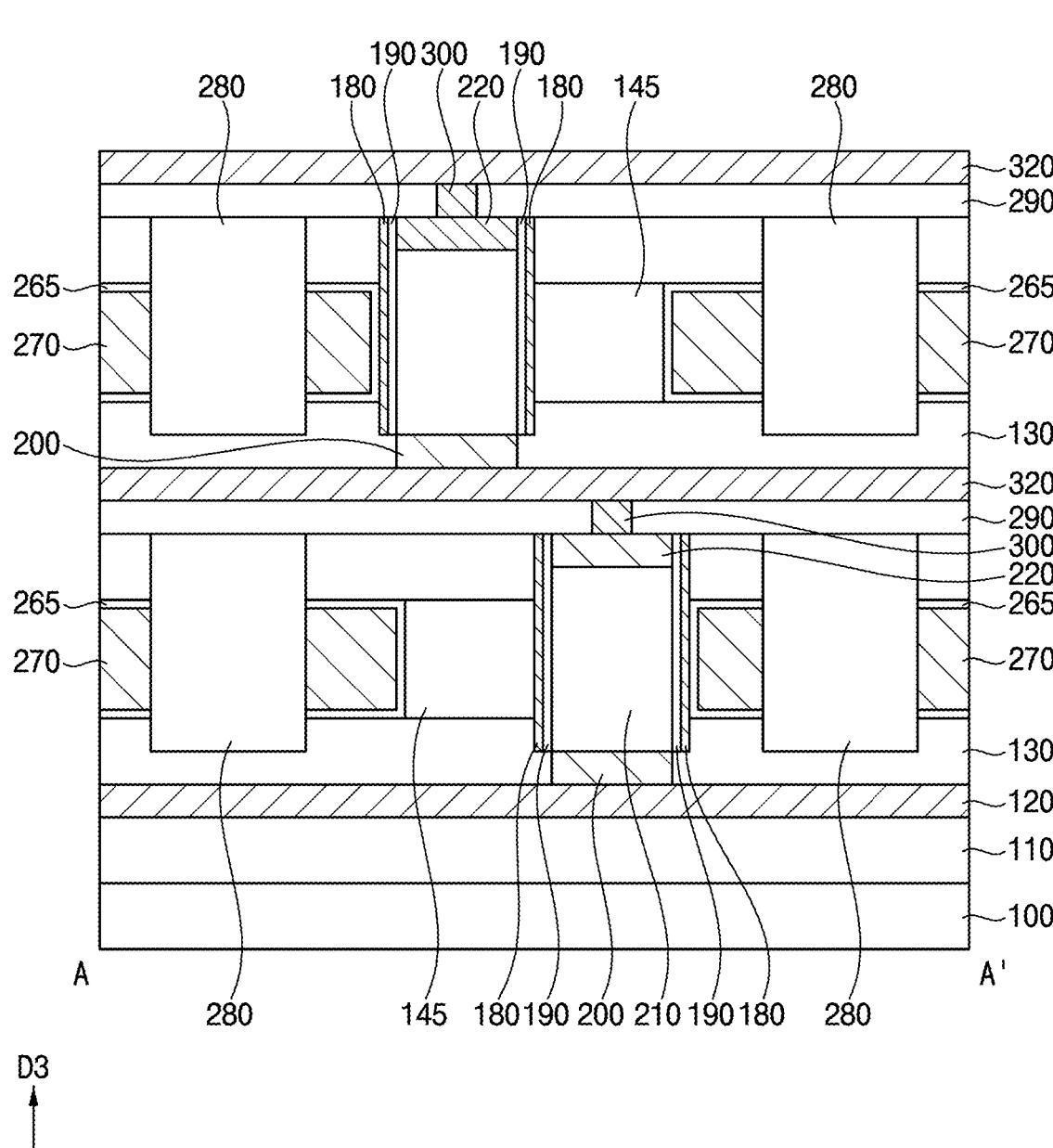
FIGS. 35 and 36 are cross-sectional views of the three-dimensional ferroelectric memory device.
Figure 36:
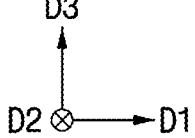

FIG. 34 is a plan view illustrating a 3D ferroelectric memory device in accordance with example embodiments, and FIGS. 35 and 36 are cross-sectional views of the 3D ferroelectric memory device. FIG. 34 illustrates layouts of lower and upper ones of the pillar structures.

Referring to FIGS. 34 and 35, the 3D ferroelectric memory device may have a stack structure in which the 3D ferroelectric memory devices shown in FIGS. 1 to 3 are stacked in the third direction D3. However, unlike that of FIG. 33, the 3D ferroelectric memory devices stacked in the third direction D3 may share the third wiring 320. That is, an upper one of the 3D ferroelectric memory devices may not include an additional first wiring 120.

The third wiring 320 may serve as a source line of a lower one of the 3D ferroelectric memory devices, and may also serve as a bit line of the upper one of the 3D ferroelectric memory devices. In example embodiments, first pillar structures included in the lower one of the 3D ferroelectric memory devices and second pillar structures included in the upper one of the 3D ferroelectric memory devices may not overlap each other in the third direction D3, but may be offset with each other.

Referring to FIG. 36, the first pillar structures and corresponding ones of the second pillar structures may overlap each other in the third direction D3.

Figure 37:
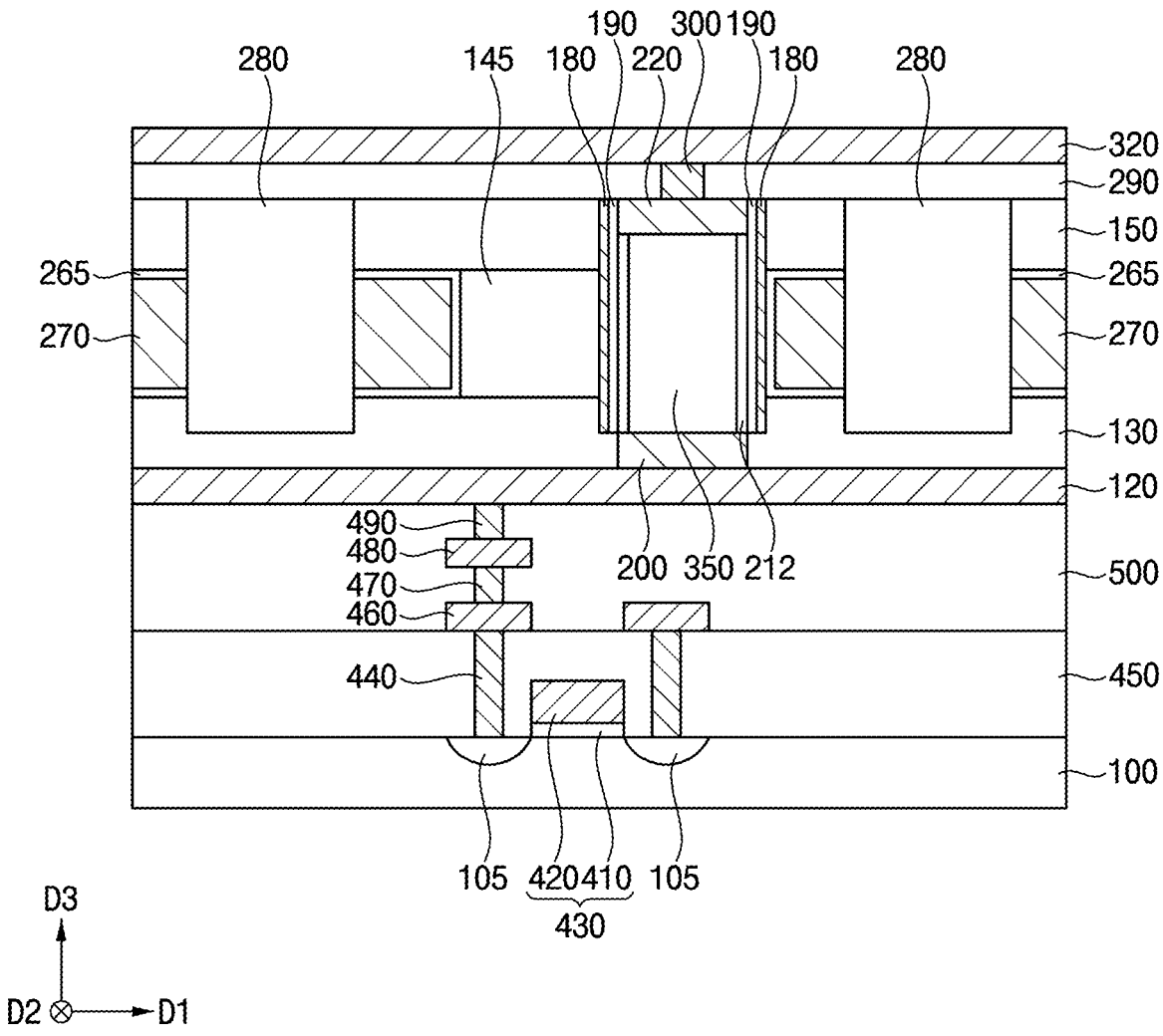
FIG. 37 is a cross-sectional view illustrating a three-dimensional ferroelectric memory device in accordance with example embodiments.

FIG. 37 is a cross-sectional view illustrating a 3D ferroelectric memory device in accordance with example embodiments. The embodiments of FIG. 37 is substantially the same as or similar to that of FIGS. 1 to 3, except for further including a lower circuit pattern, and thus, repeated explanations are omitted herein.

Referring to FIG. 37, the 3D ferroelectric memory device may include the lower circuit pattern on the first substrate 100, and thus may have a cell over periphery (COP) structure. In an example embodiment, the lower circuit pattern may include a transistor, second to fourth contact plugs 440, 470 and 490, and fourth and fifth wirings 460 and 480.

The transistor may include a gate structure 430 and impurity regions 105 at upper portions of the first substrate 100 adjacent to the gate structure 430. The gate structure 430 may include a second gate insulation pattern 415 and a gate electrode 420 stacked in the third direction D3, and each of the impurity regions 105 may serve as a source/drain of the transistor.

The second contact plug 440 may contact an upper surface of each of the impurity regions 105, and the fourth and fifth wirings 460 and 480 may contact upper surfaces of the second and third contact plugs 440 and 470, respectively. The fourth contact plug 490 may contact an upper surface of the fifth wiring 480, and the first wiring 120 may contact an upper surface of the fourth contact plug 490.

Eighth and ninth insulating interlayers 450 and 500 may be stacked on the first substrate 100. The eighth insulating interlayer 450 may cover the transistor, and may contain the second contact plug 440. The ninth insulating interlayer 500 may contain the third and fourth contact plugs 470 and 490 and the fourth and fifth wirings 460 and 480.

Figure 38:
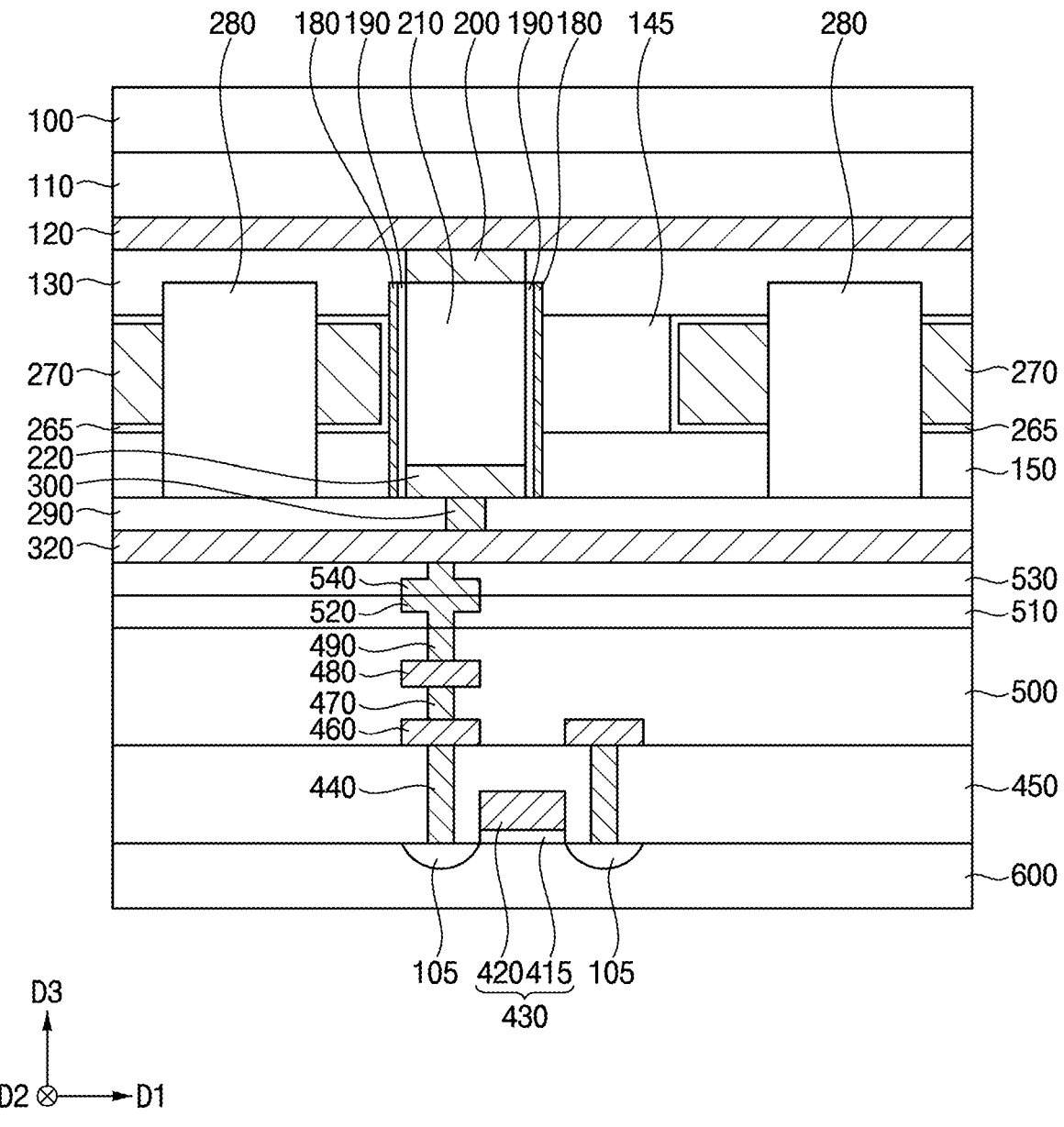
FIG. 38 is a cross-sectional view illustrating a three-dimensional ferroelectric memory device in accordance with example embodiments.

FIG. 38 is a cross-sectional view illustrating a 3D ferroelectric memory device in accordance with example embodiments. The embodiment of FIG. 38 is substantially the same as or similar to that of FIG. 37, except that structures on the lower circuit pattern are turned over and bonding structures are further formed, and thus, repeated explanations are omitted herein.

Referring to FIG. 38, the 3D ferroelectric memory device may include a lower circuit pattern on a second substrate 600, and the structures on the ninth insulating interlayer 500 of FIG. 37 may be turned over and disposed on the second substrate 600. However, tenth and eleventh insulating interlayers 510 and 530 may be stacked in the third direction D3 on the fifth insulating interlayer 310 containing the third wiring 320, and first and second bonding patterns 520 and 540 may be formed in the tenth and eleventh insulating interlayers 510 and 530, respectively. The first and second bonding patterns 520 and 540 may include a metal, e.g., copper, and may form a bonding structure.

Example embodiments provide a 3D ferroelectric memory device having an enhanced integration degree. That is, the 3D ferroelectric memory device in accordance with example embodiments may have enhanced memory window, and the gate insulation pattern of the 3D ferroelectric memory device may have enhanced endurance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional ferroelectric memory device, comprising:
    a substrate;
    a channel on the substrate, the channel extending in a vertical direction substantially perpendicular to an upper surface of the substrate;
    a gate insulation pattern and a conductive pattern stacked on and surrounding a sidewall of the channel in a horizontal direction substantially parallel to the upper surface of the substrate;
    a ferroelectric pattern contacting a portion of an outer sidewall of the conductive pattern;
    a gate electrode contacting the ferroelectric pattern;
    a first source/drain pattern contacting a lower surface of the channel; and
    a second source/drain pattern contacting an upper surface of the channel.

2. The three-dimensional ferroelectric memory device as claimed in claim 1, wherein a length in the vertical direction of the conductive pattern is greater than a length in the vertical direction of the gate electrode.

3. The three-dimensional ferroelectric memory device as claimed in claim 1, wherein the channel has a shape of a pillar extending in the vertical direction.

4. The three-dimensional ferroelectric memory device as claimed in claim 1, wherein the channel has a shape of a hollow cylinder extending in the vertical direction.

5. The three-dimensional ferroelectric memory device as claimed in claim 1, wherein the channel includes:
    a first channel having a shape of a cup; and
    a second channel having a shape of a cup, the second channel contacting an upper surface of the first channel.

6. The three-dimensional ferroelectric memory device as claimed in claim 5, further comprising a filling pattern, a lower surface and a sidewall of the filling pattern being covered by the first channel, and an upper surface of the filling pattern being covered by the second channel.

7. The three-dimensional ferroelectric memory device as claimed in claim 5, wherein each of the first channel and the second channel includes a two-dimensional material.

8. The three-dimensional ferroelectric memory device as claimed in claim 1, wherein each of the first source/drain pattern and the second source/drain pattern includes polysilicon or silicon-germanium doped with n-type or p-type impurities.

9. The three-dimensional ferroelectric memory device as claimed in claim 1, wherein the first source/drain pattern has a shape of a pillar.

10. The three-dimensional ferroelectric memory device as claimed in claim 1, wherein the first source/drain pattern has a shape of a line extending in a predetermined direction.

11. The three-dimensional ferroelectric memory device as claimed in claim 1, wherein a sidewall of the second source/drain pattern is covered by the gate insulation pattern.

12. The three-dimensional ferroelectric memory device as claimed in claim 1, further comprising:
    a bit line on the substrate, the bit line extending in a first direction substantially parallel to the upper surface of the substrate and contacting the first source/drain pattern; and
    a source line on the second source/drain pattern, the source line extending in the first direction and being connected to the second source/drain pattern.

13. The three-dimensional ferroelectric memory device as claimed in claim 12, wherein the gate electrode extends in a second direction substantially parallel to the upper surface of the substrate and crossing the first direction, the gate electrode being a word line.

14. A three-dimensional ferroelectric memory device, comprising:
    a substrate;
    a channel on the substrate, the channel extending in a vertical direction substantially perpendicular to an upper surface of the substrate;
    a gate insulation pattern and a conductive pattern sequentially stacked on a sidewall of the channel in a horizontal direction substantially parallel to the upper surface of the substrate;
    a ferroelectric pattern contacting a portion of an outer sidewall of the conductive pattern;
    a gate electrode contacting the ferroelectric pattern;
    a first source/drain pattern contacting a lower surface of the channel; and
    a second source/drain pattern contacting an upper surface of the channel,
    wherein an area of a portion of the gate insulation pattern between and contacting the channel and the conductive pattern is greater than an area of a portion of the ferroelectric pattern between and contacting the conductive pattern and the gate electrode.

15. The three-dimensional ferroelectric memory device as claimed in claim 14, wherein a width of the portion of the gate insulation pattern in the horizontal direction is greater than a width of the portion of the ferroelectric pattern in the horizontal direction.

16. The three-dimensional ferroelectric memory device as claimed in claim 14, wherein a height of the portion of the gate insulation pattern in the vertical direction is greater than a height of the portion of the ferroelectric pattern in the vertical direction.

17. A three-dimensional ferroelectric memory device, comprising:
    a substrate;
    a bit line on the substrate, the bit line extending in a first direction substantially parallel to an upper surface of the substrate;
    a first source/drain pattern contacting an upper surface of the bit line;
    a channel contacting an upper surface of the first source/drain pattern, the channel extending in a vertical direction substantially perpendicular to the upper surface of the substrate;
    a gate insulation pattern and a conductive pattern stacked on and surrounding a sidewall of the channel in a horizontal direction substantially parallel to the upper surface of the substrate;
    a ferroelectric pattern contacting a portion of an outer sidewall of the conductive pattern;

a word line contacting the ferroelectric pattern, the word line extending in a second direction substantially parallel to the upper surface of the substrate and crossing the first direction;

a second source/drain pattern contacting an upper surface of the channel; and a source line contacting an upper surface of the second source/drain pattern, the source line extending in the first direction.

18. The three-dimensional ferroelectric memory device as claimed in claim 17, wherein the bit line is one of a plurality of bit lines spaced apart from each other in the second direction, the word line is one of a plurality of word lines spaced apart from each other in the first direction, and the source line is one of a plurality of source lines spaced apart from each other in the second direction.

19. The three-dimensional ferroelectric memory device as claimed in claim 18, further comprising an insulation pattern on the plurality of bit lines between ones of the plurality of word lines neighboring in the first direction, a pillar structure including the channel, the gate insulation pattern, and the conductive pattern extending through the insulation pattern.

20. The three-dimensional ferroelectric memory device as claimed in claim 19, wherein:

the pillar structure is one of a plurality of pillar structures spaced apart from each other between ones of the word lines neighboring in the first direction, and the plurality of pillar structures are arranged in a zigzag pattern in the second direction.

\*   \*   \*   \*   \*